US012769206B2

(12) United States Patent
Wang et al.

(10) Patent No.: US 12,769,206 B2
(45) Date of Patent: Oct. 20, 2026

(54) RESIN COMPOSITION, RESIN FILM AND DISPLAY DEVICE

(71) Applicant: JILIN OLED OPTICAL AND ELECTRONIC MATERIALS CO., LTD., Changchun (CN)

(72) Inventors: Hui Wang, Changchun (CN); Jianhang Li, Changchun (CN)

(73) Assignee: JILIN OLED OPTICAL AND ELECTRONIC MATERIALS CO., LTD., Changchun (CN)

( * ) Notice: Subject to any disclaimer, the term of this patent is extended or adjusted under 35 U.S.C. 154(b) by 593 days.

(21) Appl. No.: 17/785,839

(22) PCT Filed: Apr. 14, 2022

(86) PCT No.: PCT/CN2022/086798

§ 371 (c)(1),
(2) Date: Jun. 15, 2022

(87) PCT Pub. No.: WO2023/005263

PCT Pub. Date: Feb. 2, 2023

(65) Prior Publication Data

US 2023/0104913 A1 Apr. 6, 2023

(30) Foreign Application Priority Data

Jul. 27, 2021 (CN) ........................ 202110851447.X

(51) Int. Cl.

| | |
|---|---|
| ***G03F 7/037*** | (2006.01) |
| ***G03F 7/004*** | (2006.01) |
| ***G03F 7/039*** | (2006.01) |
| ***G03F 7/26*** | (2006.01) |

(52) U.S. Cl.

CPC ............ *G03F 7/037* (2013.01); *G03F 7/0045* (2013.01); *G03F 7/0392* (2013.01); *G03F 7/26* (2013.01)

(58) Field of Classification Search

None

See application file for complete search history.

(56) References Cited

U.S. PATENT DOCUMENTS

2018/0051136 A1* 2/2018 Koyama ................. G03F 7/168

FOREIGN PATENT DOCUMENTS

| | | | | |
|---|---|---|---|---|
| CN | 1577088 | A | 2/2005 | |
| CN | 101268119 | A | 9/2008 | |
| CN | 102471664 | A | 5/2012 | |
| CN | 105579500 | A | 5/2016 | |
| CN | 105646883 | | 6/2016 | |
| CN | 110892326 | A | 3/2020 | |
| CN | 112424289 | A | 2/2021 | |
| JP | 2007264028 | A | 10/2007 | |
| JP | 2013174843 | A | 9/2013 | |
| JP | 2015129791 | A | 7/2015 | |
| JP | 2020066651 | B | 1/2023 | |
| KR | 20210073517 | A | 6/2021 | |
| TW | 202024790 | A | 7/2020 | |
| TW | 202107204 | A | 2/2021 | |
| WO | 2018066395 | A1 | 4/2018 | |
| WO | 2019087985 | A1 | 5/2019 | |
| WO | WO-2020026937 | A1 * | 2/2020 | ......... C08G 73/1017 |
| WO | 2020075592 | A1 | 4/2020 | |

OTHER PUBLICATIONS

WO2020026937 English Translation (Year: 2024).*

* cited by examiner

*Primary Examiner* — Benjamin L Utech

(74) *Attorney, Agent, or Firm* — Enable IP, P.C.

(57) ABSTRACT

According to the present invention, a resin composition can be provided, comprising at least three components (a), (b) and (c), wherein component (a) is a polymer having a structure represented by the following formula (1), component (b) comprises thermal crosslinking agent (b1) and thermal crosslinking agent (b2), and component (c) is a photosensitizer, wherein $R^1$ and $R^2$ are independently selected from groups containing at least one atom other than hydrogen; and $R^3$ and $R^4$ are independently selected from a hydrogen atom or an organic group having 1 to 20 carbon atoms, and n is an integer selected from 1 to 10. The use of the resin composition of the present invention can result in a better flatness and bending recovery performance.

7 Claims, No Drawings

RESIN COMPOSITION, RESIN FILM AND DISPLAY DEVICE

TECHNICAL FIELD

The present invention relates to a resin composition, a resin film formed from the resin composition, and a display device formed using the resin composition and/or the resin film.

BACKGROUND ART

In recent years, organic electroluminescent (hereinafter referred to as "organic EL") display devices have been widely used in many pieces of electronic equipment. Generally, the organic EL display device has a drive circuit, a planarization layer, a first electrode, an insulation layer, a light-emitting layer and a second electrode on a substrate, and emits light by applying a voltage between the first electrode and the second electrode, which are disposed opposite, or by the flow of the current. In the organic EL display device, as the material of the planarization layer and the material of the insulation layer, a photosensitive resin composition that can be used for patterning by ultraviolet irradiation is usually used.

With the miniaturization, high functionalization and high integration of electronic equipment, the performance requirements of electronic components used in such electronic equipment are also increasing. Since resins such as polyimide, polybenzoxazole, and polyamideimide have excellent properties in terms of heat resistance, electrical insulation, etc., a photosensitive resin composition containing such a resin is suitable as a material for the insulation layer or planarization layer of the organic EL display device.

On the other hand, in a flexible organic EL display device including a curved part, the material for the insulation layer or planarization layer is required to have a better flatness and bending performance. Therefore, it is also of a great significance to improve the flatness and bending performance of the photosensitive resin composition.

At present, it is known that phenolic hydroxyl compounds can be introduced into polyimide precursors to solve the problem of development failure in a short time and in turn improve the resolution of fine patterns. However, there are problems such as compound scattering and thermal shrinkage during curing (Patent document 1). In addition, it is known that the introduction of a thermal crosslinking agent into a photosensitive resin precursor composition can reduce the thermal shrinkage rate; however, the obtained photosensitive resin precursor composition has problems such as poor bending resistance and easy formation of marks and creases (Patent document 2).

LITERATURES OF PRIOR ART

Patent Document

Patent document 1: CN 1246389 C

Patent document 2: CN 100362429 C

SUMMARY OF THE INVENTION

When the photosensitive resin precursor compositions described in the above patent documents are used in organic EL display devices, many problems such as insufficient long-term reliability, poor flexibility, and poor flatness appear. Therefore, the technical solution of the present invention mainly aims to solve the above-mentioned problems.

According to an embodiment of the present invention, a resin composition can be provided, comprising at least three components (a), (b) and (c); wherein component (a) is a polymer having a structure represented by the following formula (1), component (b) comprises thermal crosslinking agent (b1) and thermal crosslinking agent (b2), and component (c) is a photosensitizer, formula (1)

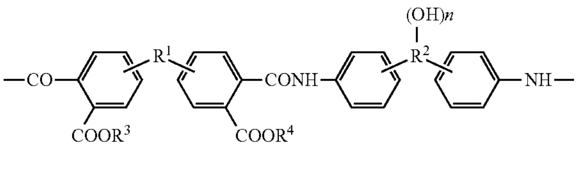

wherein $R^1$ and $R^2$ are independently selected from groups containing at least one atom other than hydrogen; and $R^3$ and $R^4$ are independently selected from a hydrogen atom or an organic group having 1 to 20 carbon atoms, and n is an integer selected from 1 to 10.

In another embodiment of the present invention, thermal crosslinking agent (b1) is an aromatic ester thermal crosslinking agent, and thermal crosslinking agent (b2) is a thermal crosslinking agent containing an unsaturated bond.

In another embodiment of the present invention, thermal crosslinking agent (b1) is selected from a low-temperature thermal crosslinking compound with a thermal crosslinking temperature of 120° C. to 180° C., more particularly from a structure represented by the following formula (2), formula (2)

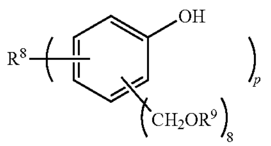

wherein R is selected from an organic group containing 2 to 30 carbon atoms; $R^9$ is selected from an organic group containing 1 to 10 carbon atoms; and s is an integer selected from 1 to 4, p is an integer selected from 1 to 16, and s+p>2.

In another embodiment of the present invention, thermal crosslinking agent (b2) is selected from a thermal crosslinking compound with a thermal crosslinking temperature of 180° C. to 400° C., more particularly from one or more of a structure represented by the following formula (3) and/or a structure represented by the following formula (4), formual (3)

$$R^6{-}\!(HC{=}CH_2)_y$$

formula (4)

$$R^7{-}\!(C{\equiv}CH)_q$$

wherein $R^6$ and $R^7$ are independently selected from an organic group containing at least 2 to 30 carbon atoms; and y and q are independently an integer selected from 1 to 10.

In another embodiment of the present invention, the structure represented by formula (3) is a structure containing acrylic acid and is more particularly selected from one or more structures represented by the following formula (5), formula (5)

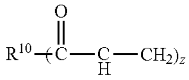

wherein $R^{10}$ is selected from an organic group containing 2 to 25 carbon atoms, and z is an integer selected from 1 to 10.

In another embodiment of the present invention, where component (a) is a polymer having a structure represented by the following formula (6), formula (6)

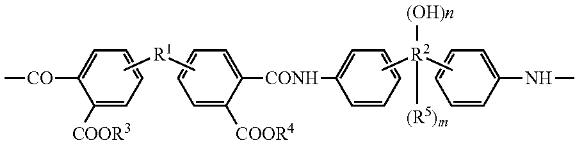

wherein $R^1$ and $R^2$ are independently selected from groups containing at least one atom other than hydrogen; $R^3$ and $R^4$ are independently selected from a hydrogen atom or an organic group having 1 to 20 carbon atoms, and $R^5$ is selected from a halogen and/or a halogenated hydrocarbyl and/or an organic group having 1 to 10 carbon atoms; and n and m are independently an integer selected from 1 to 10.

In another embodiment of the present invention, one or more of polyamide, polyimide, a polyimide precursor, polybenzoxazole, a polybenzoxazole precursor, or copolymers thereof may also be included.

In another embodiment of the present invention, the photosensitizer of component (c) is a photoacid generator.

In another embodiment of the present invention, a phenolic hydroxyl compound is also included.

According to another embodiment of the present invention, a resin film may be provided, which is prepared from the photosensitive resin composition of the present invention.

According to another embodiment of the present invention, a display device may be provided, which is prepared from the resin composition of the present invention or comprises the resin film of the present invention.

In another embodiment of the present invention, component (a1) may also be further included, wherein component (a1) contains an aliphatic group with a siloxane structure. Preferably, component (a1) contains a structure represented by formula (7), formula (7)

$-HN-R^{11}-NH-$ and/or 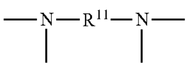

wherein $R^{11}$ is an organic group containing at least 1 to 20 repeating units of Si—O, and also contains an aliphatic group.

In another embodiment of the present invention, $R^{11}$ is selected from one or more of structures shown below:

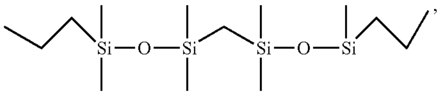,

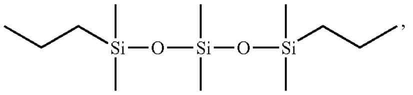,

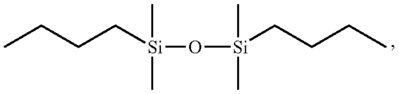,

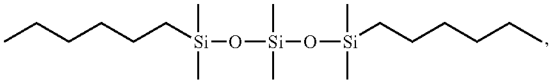,

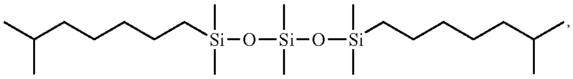,

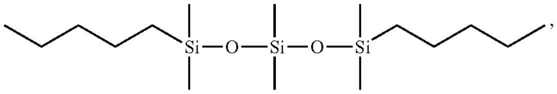,

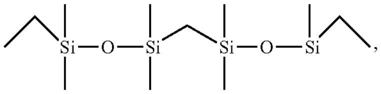, and

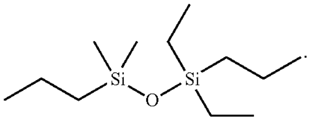.

In another embodiment of the present invention, the weight proportion of component (a1) is 0.01 wt % to 10 wt % relative to component (a).

In another embodiment of the present invention, residues containing $R^1$ may be selected from one or more of structures shown below:

—O—, —$SO_2$—, —NH—, —CO—,

—Si—O—, 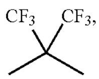,

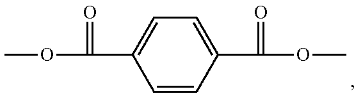,

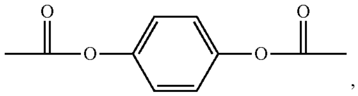,

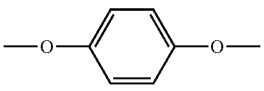, 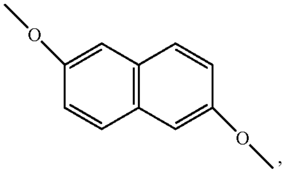,

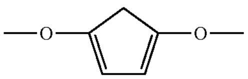, 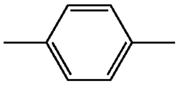,

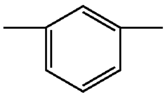, 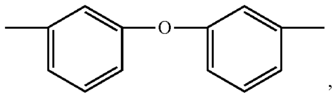,

-continued

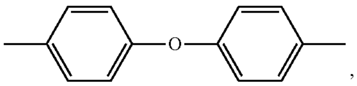,

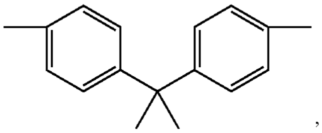,

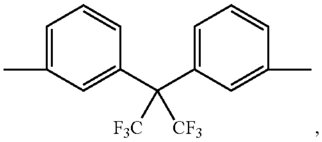,

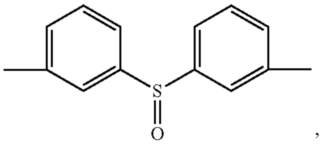,

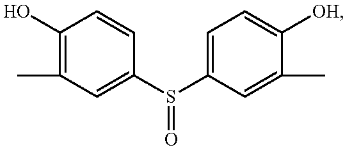

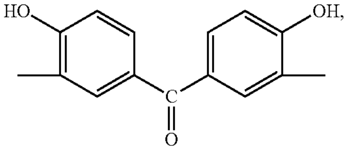

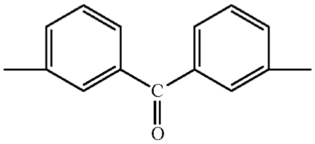, 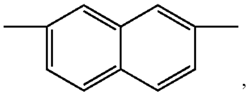,

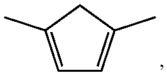, 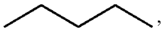, 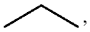, 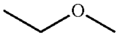,

, and 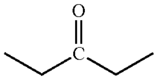.

In another embodiment of the present invention, the residues containing $R^1$ may be further selected from one or more of structures shown below:

—O—, —$SO_2$—, —NH—, —CO—,

—Si—O—, 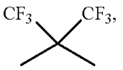, 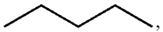,

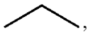, 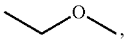, 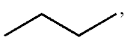, and

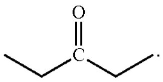.

In another embodiment of the present invention, the residues containing $R^2$ may be selected from one or more of structures shown below:

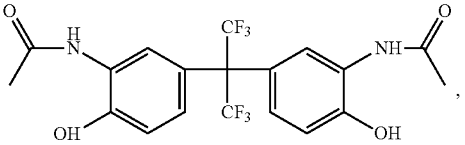,

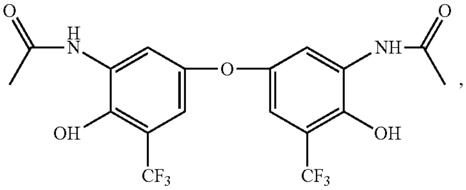,

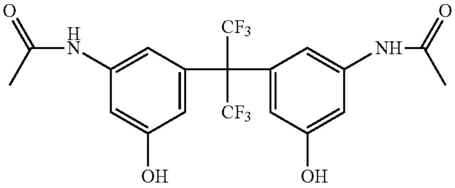,

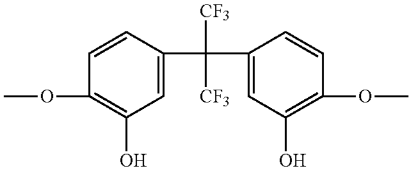,

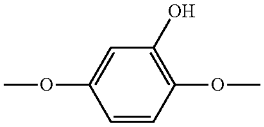,

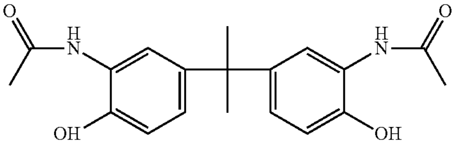,

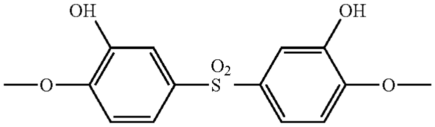,

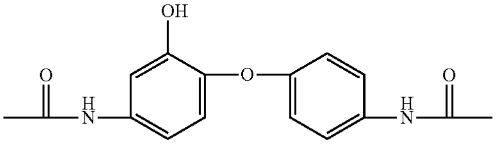, and

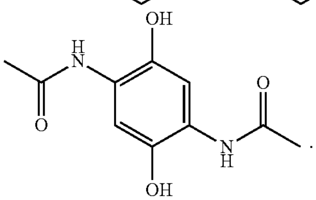.

In view of the degree of graphic refinement, the residues containing $R^2$ preferably have structures shown below:

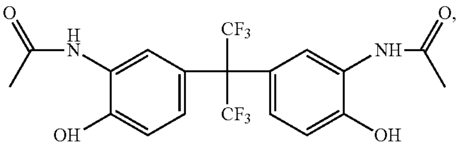

-continued
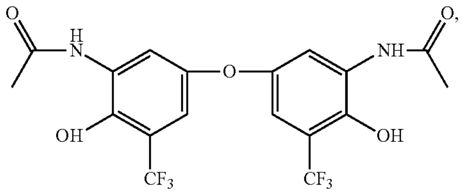
,
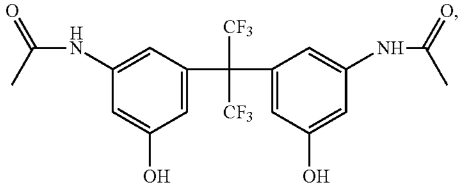
, and
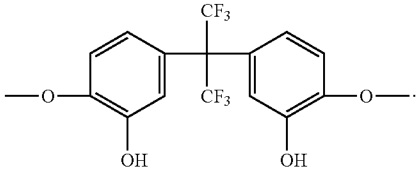
.
In another embodiment of the present invention, thermal crosslinking agent (b1) may be specifically selected from one or more of the following compounds:
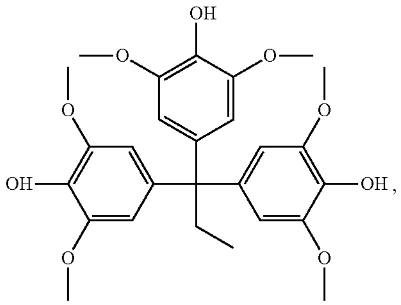
,
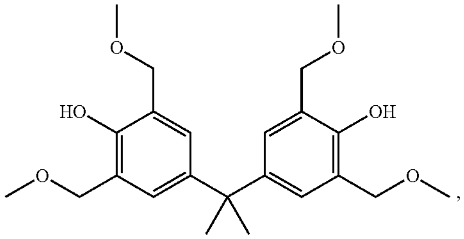
,
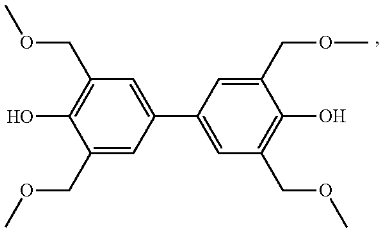
,
-continued
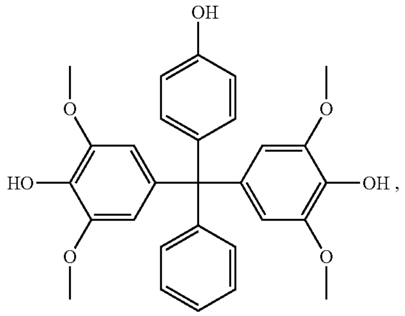
,
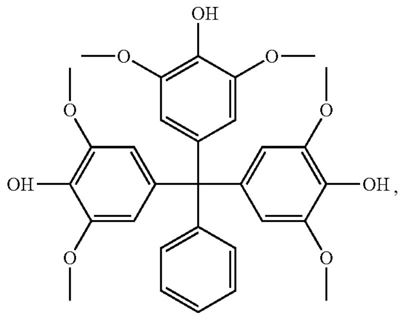
,
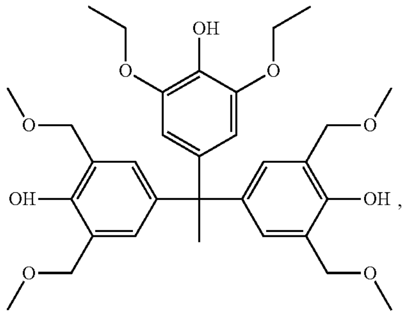
,
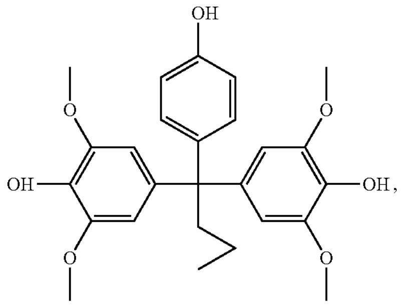
, -continued
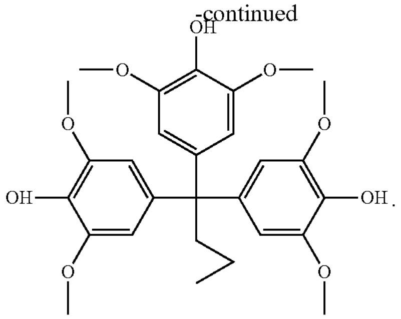
In another embodiment of the present invention, thermal crosslinking agent (b1) may be more specifically selected from one or more of the following compounds:
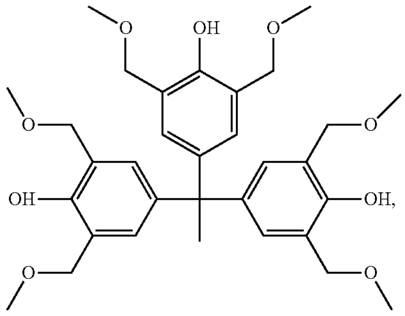
-continued
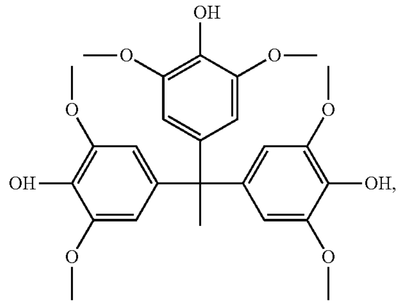
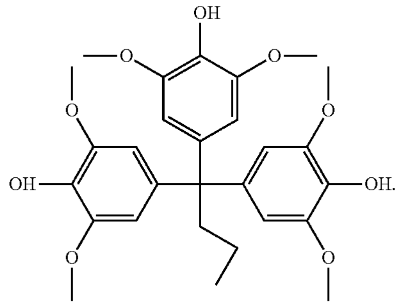
In another embodiment of the present invention, where thermal crosslinking agent (b2) may be specifically selected from one or more of the following compounds:
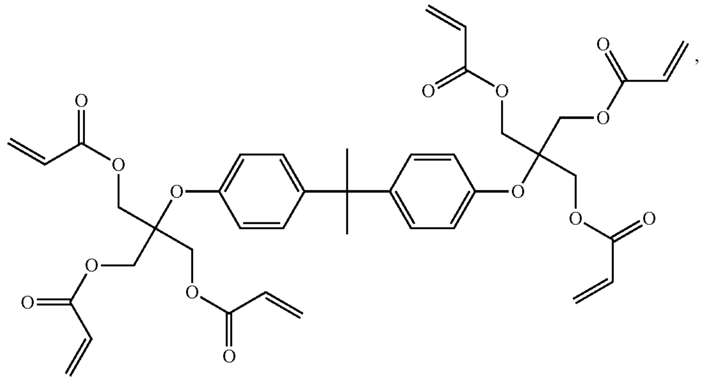
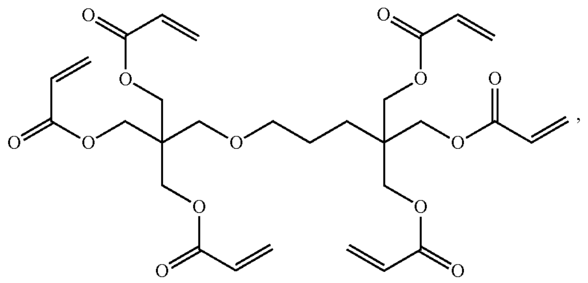

-continued
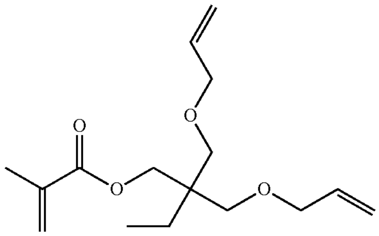
,
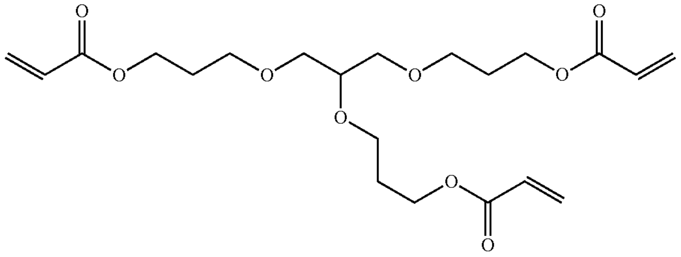
,
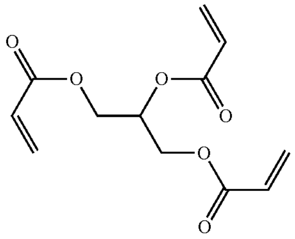
,
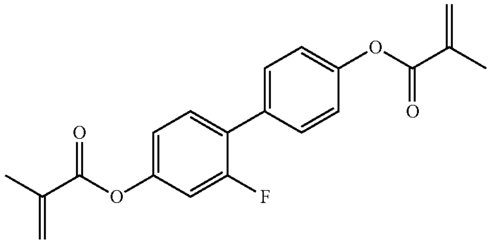
,
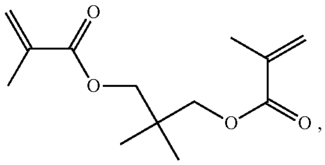
,
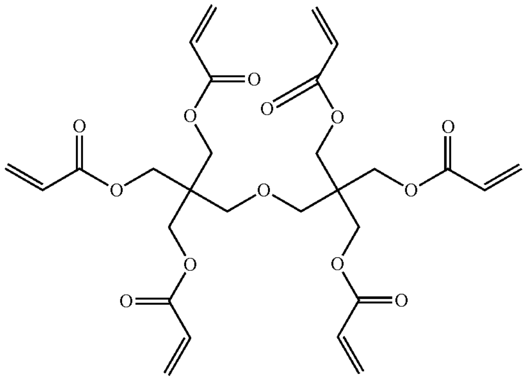
, -continued
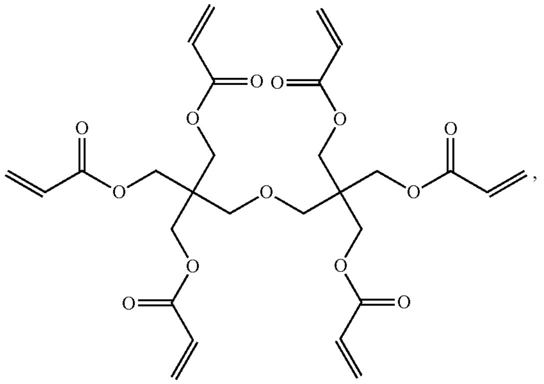
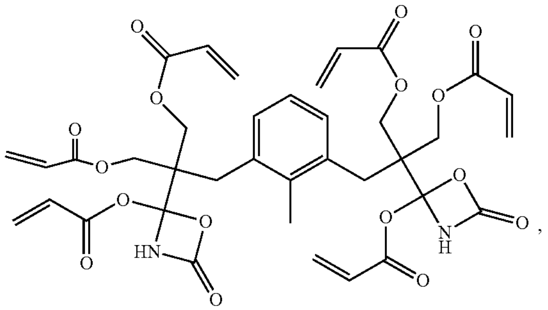
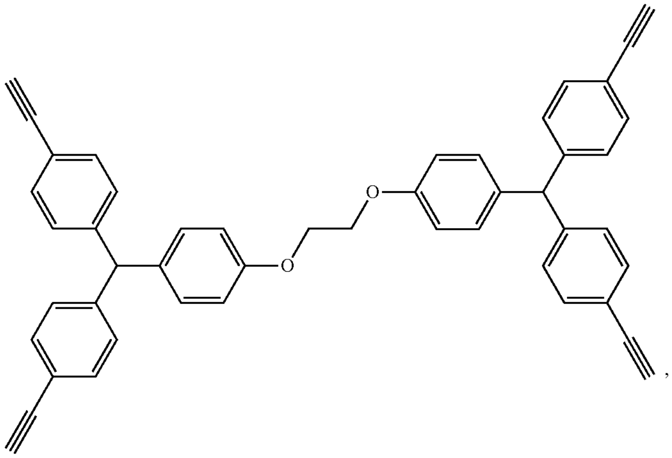
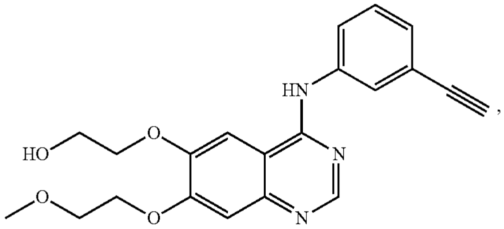
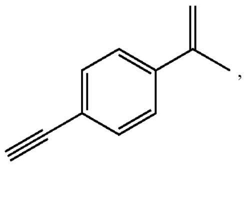

-continued

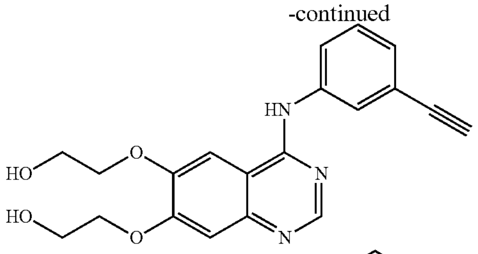

,

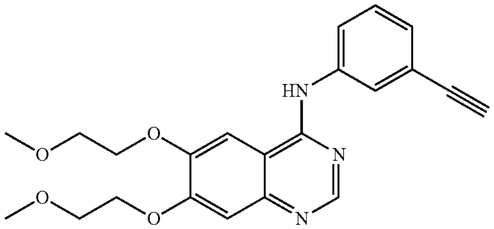

,

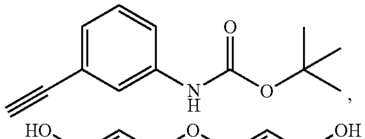

,

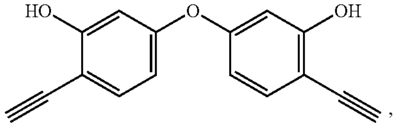

, and

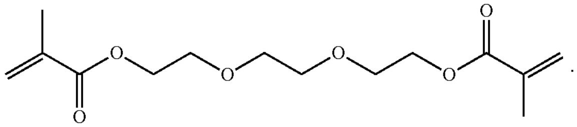

.

After intensive study, the inventors have found that by using the resin composition of the present invention, a better flatness and bending recovery performance can be obtained, and an organic EL display device with a good luminous efficiency and flexibility can be obtained.

DETAILED DESCRIPTION OF EMBODIMENTS

In order to make the objects and advantages of the present invention clearer, the technical solutions of the present invention will be further clearly and completely described below in combination with the embodiments of the present invention. Obviously, the described embodiments are only some of the embodiments of the present invention and are intended to help those skilled in the art further understand the present invention, but do not limit the present invention in any way. All other embodiments obtained by those of ordinary skill in the art based on the embodiments of the present invention without any creative effort shall fall within the scope of protection of the present invention.

<Resin Composition>

The resin composition of the present invention can contain at least three components (a). (b) and (c), wherein component (a) is a polymer with a structure represented by formula (1), component (b) includes thermal crosslinking agent (b1) and thermal crosslinking agent (b2), and component (c) is a photosensitizer.

Component (a) is a polymer with a structure represented by formula (1), containing an alkali-soluble group such as hydroxyl, which can be called an alkali-soluble polymer.

formula (1)

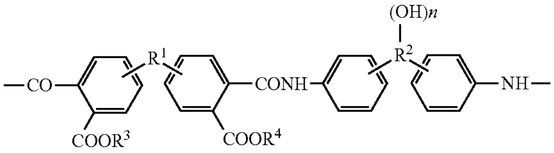

wherein $R^1$ and $R^2$ are independently selected from groups containing at least one atom other than hydrogen; and $R^3$ and $R^4$ are independently selected from a hydrogen atom or an organic group having 1 to 20 carbon atoms, and n is an integer selected from 1 to 10.

The atoms other than hydrogen contained in $R^1$ and $R^2$ are independently preferably selected from one or more of O, S, N, P, B, Si1-Si20, and C1-30. In view of the flexibility of the polymer, $R^1$ is further preferably selected from a group that does not contain an aromatic hydrocarbyl group but contains one or more of O, S. N, and C atoms. In view of the heat resistance of the polymer, $R^2$ is further preferably selected from a group that contains aromatic and/or heterocyclic aromatic groups, and it is further preferred that the aromatic and/or heterocyclic aromatic groups in $R^2$ are on the main chain of the polymer. In view of the solubility of the polymer, it is yet further preferred for $R^2$ that the hydroxyl group is directly bonded with the aromatic group and/or heterocyclic aromatic group. polymer (a) can also contain a polymer with a structure represented by formula (6), wherein $R^5$ can also be connected to $R^2$, wherein $R^5$ can be selected from a halogen and/or a halogenated hydrocarbyl and/or an organic group having 1 to 10 carbon atoms; in view of the degree of refinement of the formed graph, $R^3$ is preferably selected from a halogen and/or halogenated hydrocarbyl group with an electron withdrawing group; and n and m are independently integers selected from 1 to 10.

formula (6)

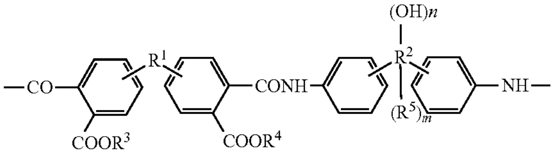

The polymer with the structure represented by formula (1) and/or formula (6) provided by the invention can be obtained by polymerizing, for example, acid dianhydride and diamine as raw materials. For example, a method for reacting acid dianhydride with a diamine compound in a solvent can be listed.

As a residue of acid dianhydride containing $R^1$ used in polymer (a), structures shown below can be specifically listed:

—O—, —$SO_2$—, —NH—,

—CO—, —Si—O—, 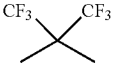,

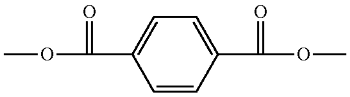,

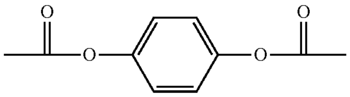,

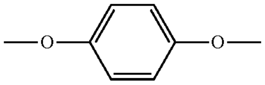,

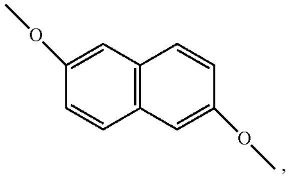,

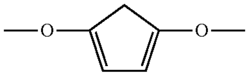, ,

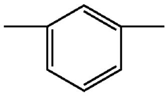, 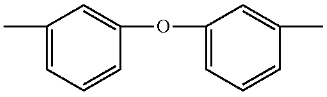,

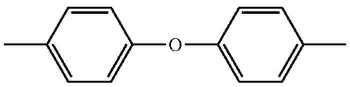.

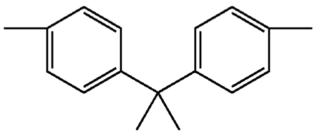,

-continued

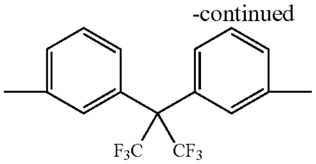,

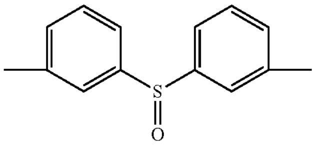,

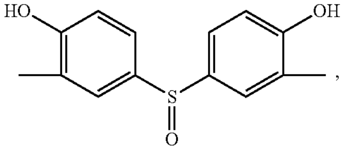,

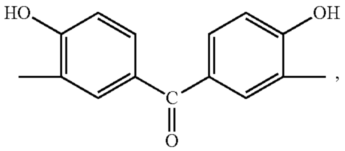,

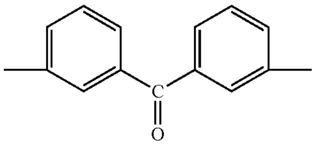,

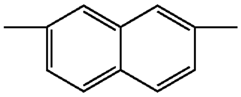, 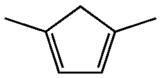,

, 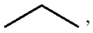, 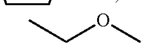,

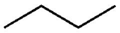, and 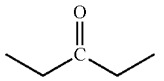.

In view of the flexibility of the polymer. $R^1$ preferably has the following group structures with a relatively small steric hindrance:

—O—, —$SO_2$—, —NH—, —CO—,

—Si—O—, 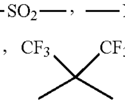, 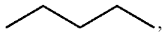,

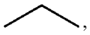, 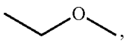, 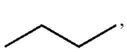, and

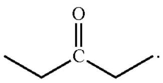.

As an acid dianhydride containing $R^1$, compounds shown below can be specifically listed:

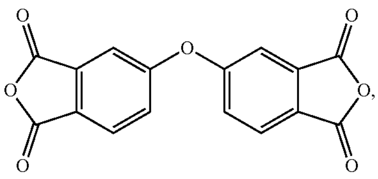

-continued
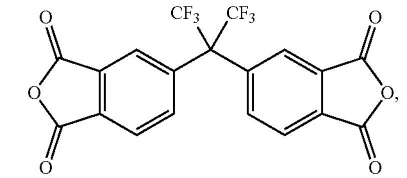
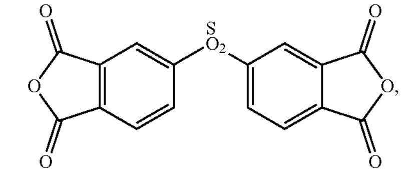
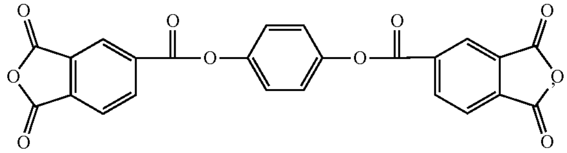
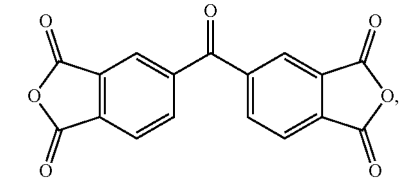
and
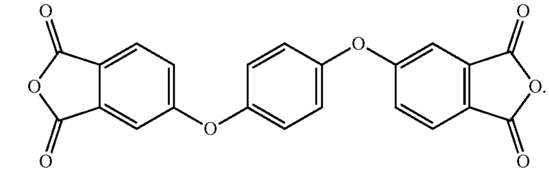
As a residue of diamine containing $R^2$ used in polymer (a), structures shown below can be specifically listed.
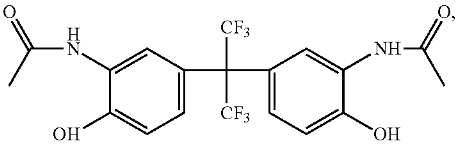
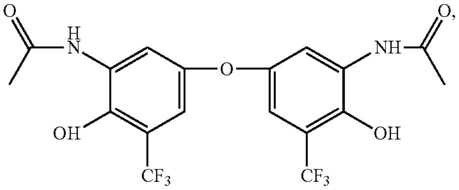
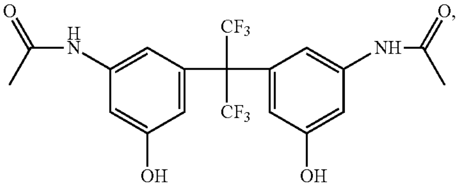
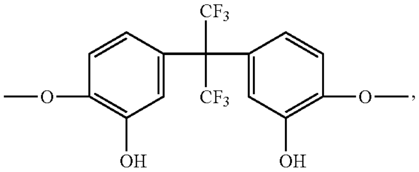
-continued
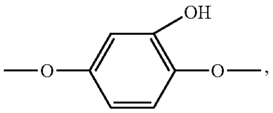
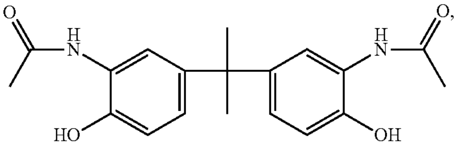
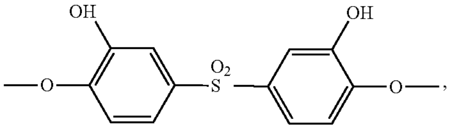
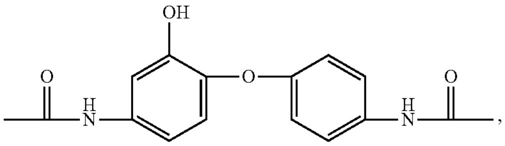
and
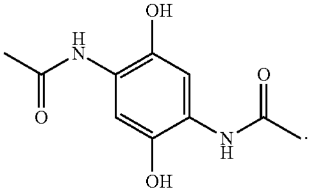
In view of the degree of graphic refinement, the diamine residue containing $R^2$ structure preferably has structures shown below:
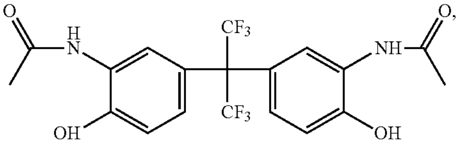
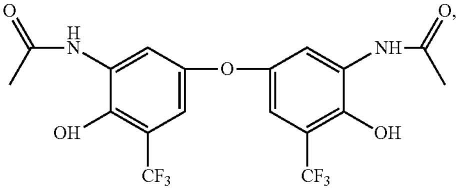
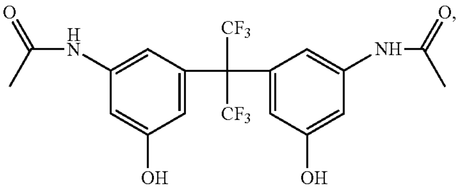
and
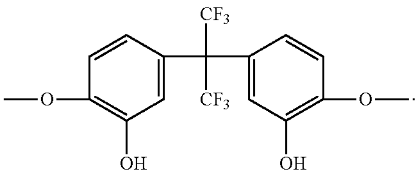

As a diamine containing $R^2$, compounds shown below can be specifically listed:
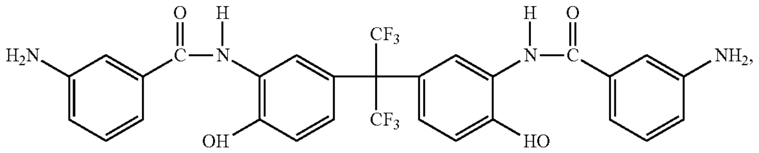
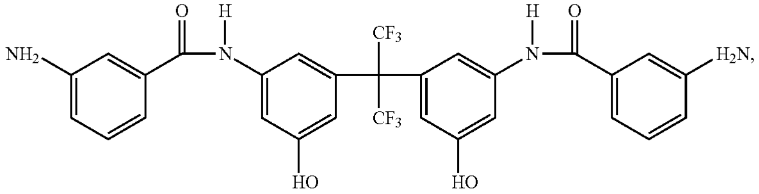
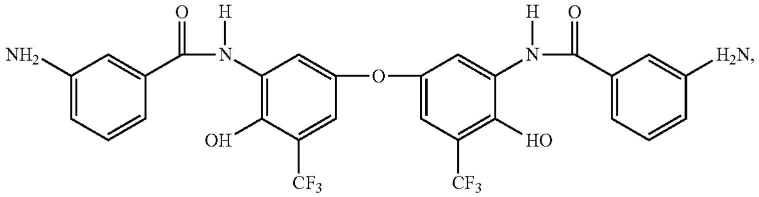
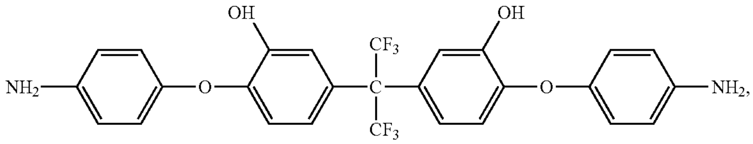
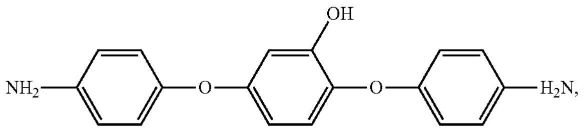
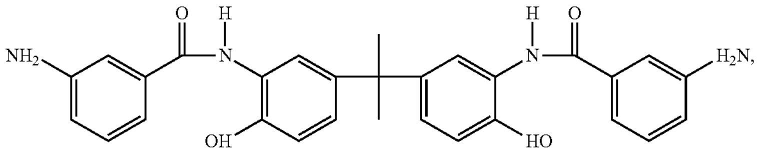
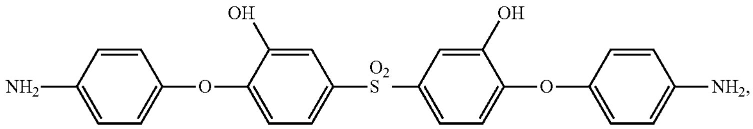
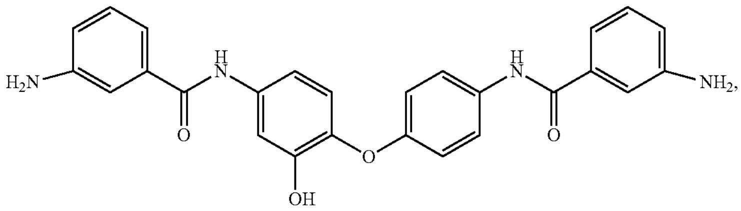
and
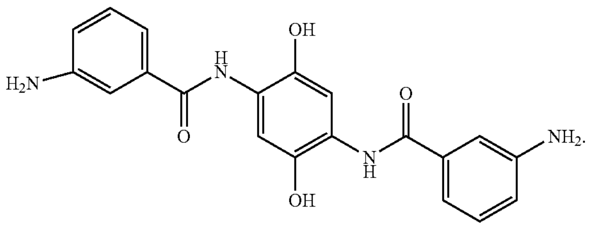

In another embodiment of the present invention, in terms of controlling the molecular weight of the polymer and the distribution thereof, the molar ratio of acid dianhydride to diamine is preferably 35:65 to 65:35, further preferably 40:60 to 60:40, and more further preferably 45:55-55:45.

In another embodiment of the present invention, one or more of polyamide, polyimide, a polyimide precursor, polybenzoxazole, a poly benzoxazole precursor, or copolymers thereof may also be included in the resin composition.

The acid dianhydride end diamine in the present invention can be used alone or in combination. Unless otherwise specified, they can both be synthesized by known methods.

In addition, for the purpose of further increasing the flexibility of the resin composition, component (a1) containing an aliphatic group with a siloxane structure can also be introduced into the resin composition, wherein the employed compound containing an aliphatic group with a siloxane structure is not particularly limited. In view of the dispersion effects after addition and the improvement of flexibility, it is preferably selected from a structure represented by formula (7):

formula (7)

$-HN-R^{11}-NH-$ and/or 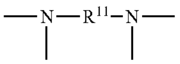

wherein $R^{11}$ is an organic group containing at least 1 to 20 repeating units of Si—O; in addition, $R^{11}$ can also contain an aliphatic group, which is connected to the siloxane in a copolymerized manner, a preferred aliphatic group has C1-C30 carbon atoms. In view of the warpage property of the polymer, the weight-average molecular weight of $R^{11}$ ranges from 10 to 5000.

Specifically, $R^{11}$ can be exemplified by one or more of structures shown below:

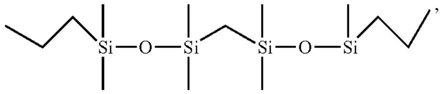,

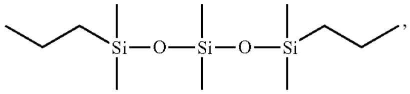,

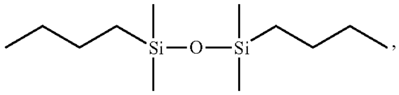,

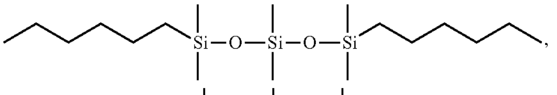,

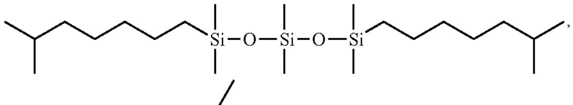,

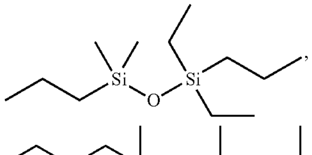,

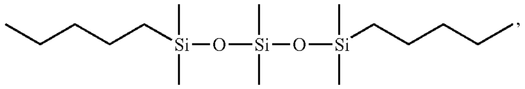, and

-continued

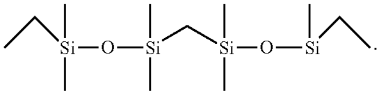.

$R^{11}$ preferably has a structure represented by

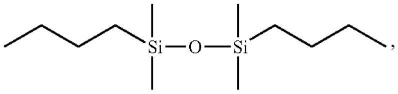,

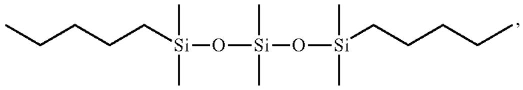, or

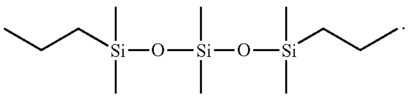.

The structure represented by formula (7) contained in component (a1) can be derived from a compound terminated with a diamine, and can be specifically exemplified by the following compounds:

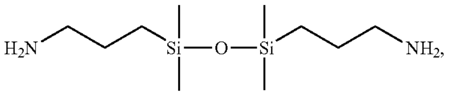,

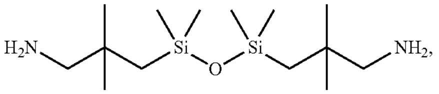,

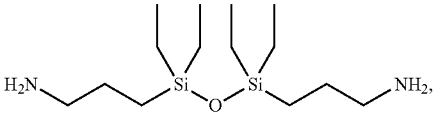,

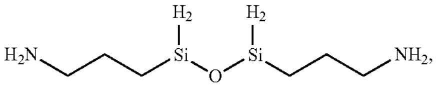,

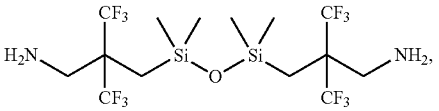,

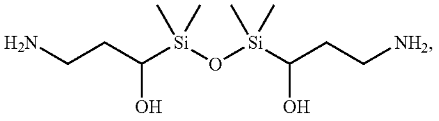,

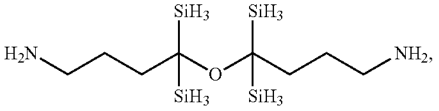,

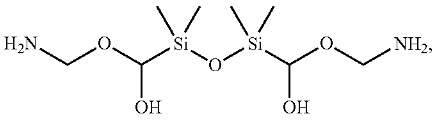,

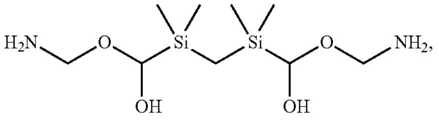,

-continued

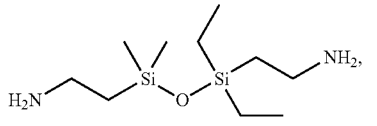
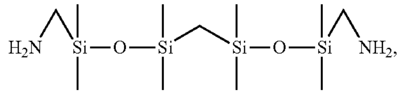
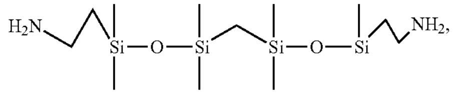
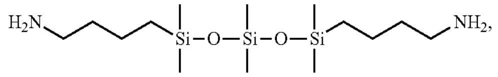
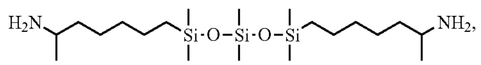
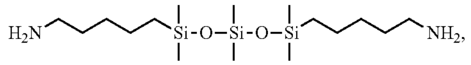
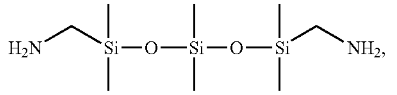
and
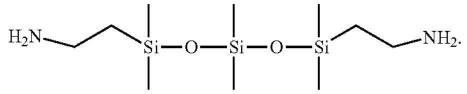

The structure represented by formula (7) contained in component (a1) can be derived from a compound terminated with a diamine, and the addition method therefor is also not particularly limited. It can be directly mixed into polymer (a) or else introduced into the main chain and/or a branch chain of polymer (a) through a polymerization reaction, that is, it can participate in the polymerization reaction as a raw material of diamine and thus be introduced into the macromolecular chain of polymer (a).

For the purpose of further increasing the flexibility of the resin composition, preferably, the addition amount of the compound containing an aliphatic group with a siloxane structure accounts for 0.01 wt % to 10 wt % relative to the total polymer.

(b) Thermal Crosslinking Agent

Component (b) contained in the resin composition of the present invention is aromatic ester thermal crosslinking agent (b1) and thermal crosslinking agent (b2) containing an unsaturated bond. Generally, the crosslinking agent can enhance the heat resistance and chemical resistance of a cured film formed from the resin composition; in addition, it should be pointed out in the present invention that the thermal crosslinking agent is used to improve the flatness of the cured film, so as to achieve a better performance and a better yield when preparing a device.

Aromatic ester thermal crosslinking agent (b1) used as the thermal crosslinking agent in the present invention is preferably selected from a low-temperature thermal crosslinking compound with a crosslinking temperature of 120° C. to 180° C., and specifically, it can be a compound represented by formula (2) below.

formula (2)

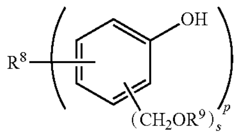

In formula (2), $R^8$ is selected from an organic group containing 2 to 30 carbon atoms; $R^9$ is selected from an organic group containing 1 to 10 carbon atoms; and s is an integer selected from 1 to 4, p is an integer selected from 1 to 16, and s+p>2. In order to achieve a better thermal crosslinking effect, formula (2) can be further preferably limited. Preferably, s is an integer of 2 to 4; preferably, p is an integer of 2 to 6; and preferably. $R^8$ is a structure containing an aromatic group or a heterocyclic aromatic group. In addition, the phenolic hydroxyl group mentioned in formula (2) can be protected by means of esterification without affecting the thermal crosslinking property, which is also part of the present invention.

Specifically, the aromatic ester thermal crosslinking agent as thermal crosslinking agent (b1) can be exemplified by one or more of compounds as shown below:

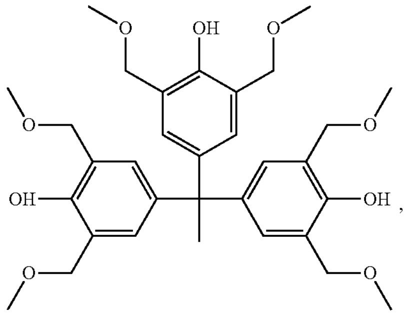

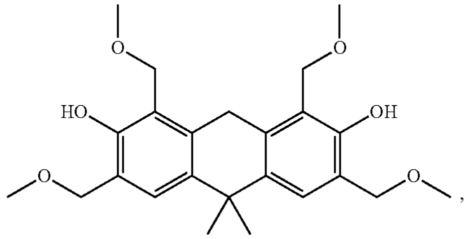

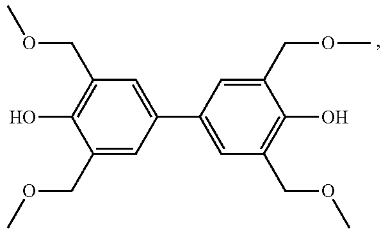

-continued

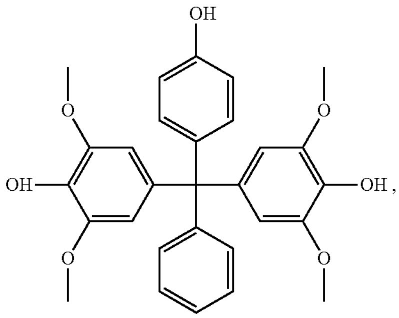,

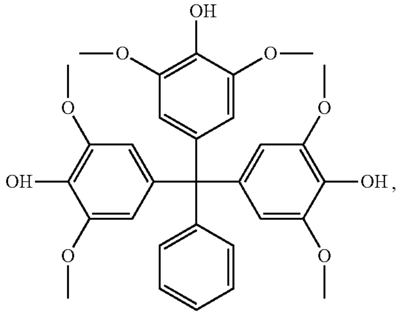,

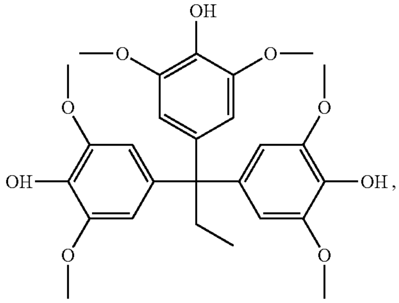,

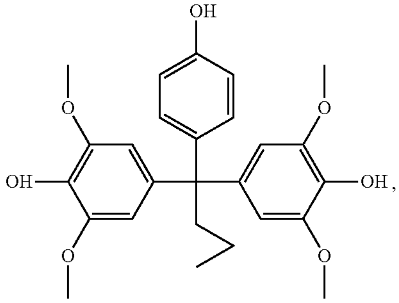, and

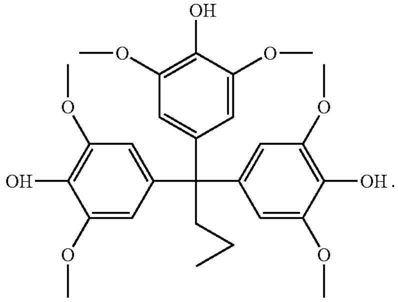.

For the aromatic ester thermal crosslinking agent as thermal crosslinking agent (b1) is preferably selected from one or more of compounds with the following structures:

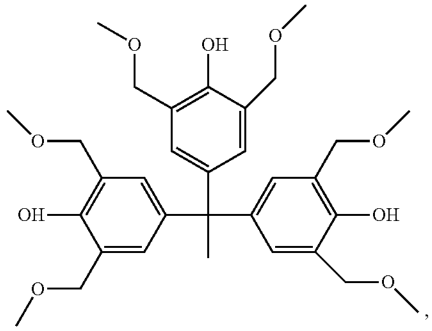,

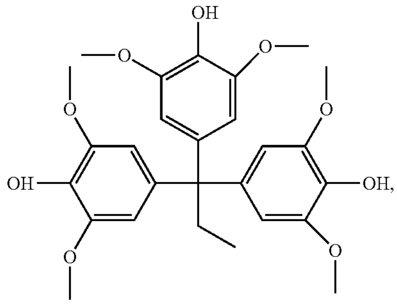 and

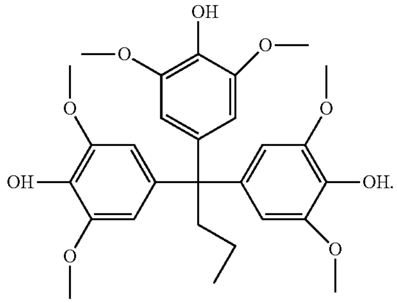.

The unsaturated bond thermal crosslinking agent as thermal crosslinking agent (b2) used in the present invention is preferably selected from a thermal crosslinking compound with a thermal crosslinking temperature of 180° C. to 400° C. Specifically, it can be selected from one or more of compounds represented by the following formula (3) and/or formula (4):

$$R^6\text{-}(CH{=}CH_2)_y \quad \text{formula (3)}$$

$$R^7\text{-}(C{\equiv}CH)_q \quad \text{formula (4)}$$

wherein $R^6$ and $R^7$ are independently selected from an organic group containing 2 to 30 carbon atoms; and y and q are independently integers selected from 1 to 10. In the formula, in addition to carbon atoms, $R^6$ can contain other heteroatoms, such as the heteroatoms O and N; preferably, the compound represented by formula (3) contains an acrylic acid structure, specifically represented as one or more of compounds represented by formula (5) below:

formula (5)

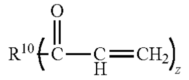

wherein $R^{10}$ is selected from an organic group containing 2 to 25 carbon atoms, and z is an integer selected from 1 to 10. In view of the thermal crosslinking effect, z is further preferably an integer selected from 2 to 8; in addition, $R^{10}$ may contain an aromatic structure or may not contain aromatic structure, both with a good thermal crosslinking performance.

In view of the thermal crosslinking effect, in the compounds represented by formula (4), q is preferably an integer selected from 1 to 6, and $R^7$ is preferably selected from a structure containing an aromatic ring.

Specifically, in the thermal crosslinking agent containing a unsaturated bond as thermal crosslinking agent (b2), the compounds represented by formula (3) and/or formula (4) can be specifically exemplified by one or more of the following compounds:

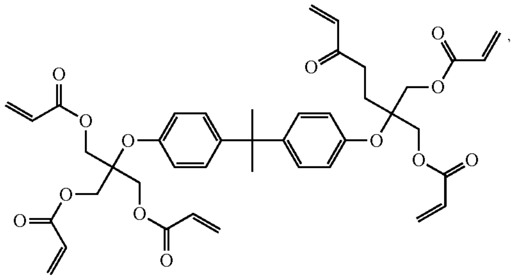

,

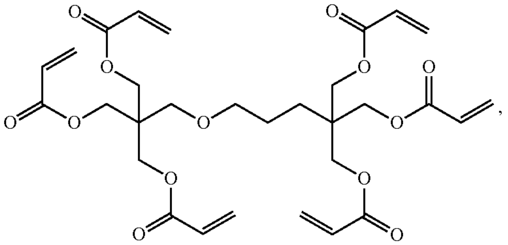

,

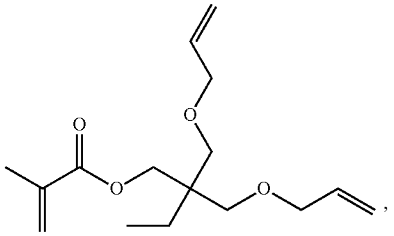

,

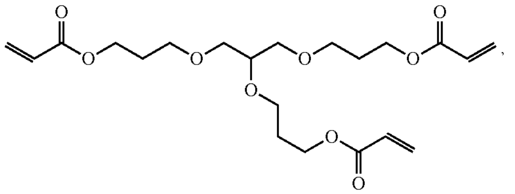

,

-continued

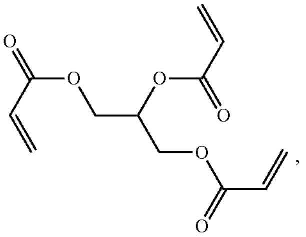

,

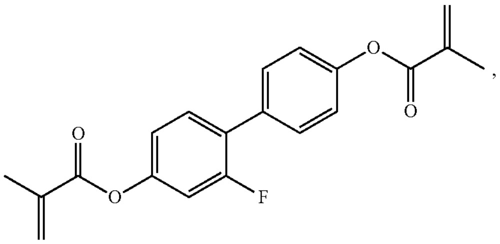

,

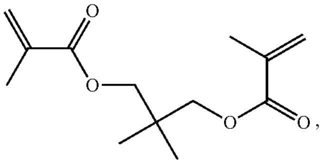

,

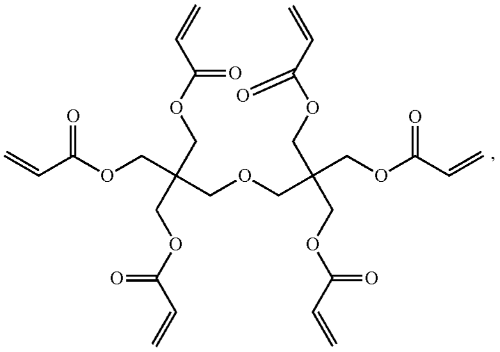

,

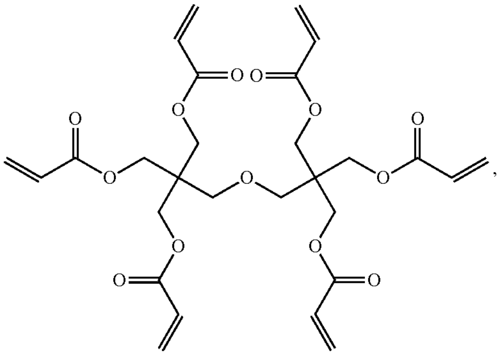

,

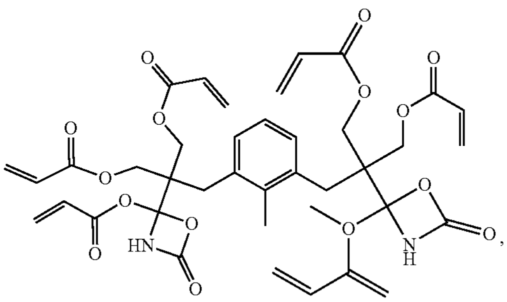

,

-continued

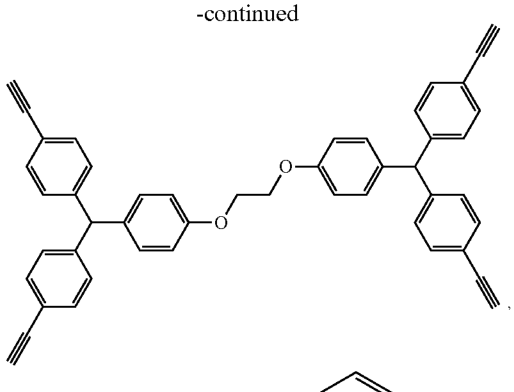

,

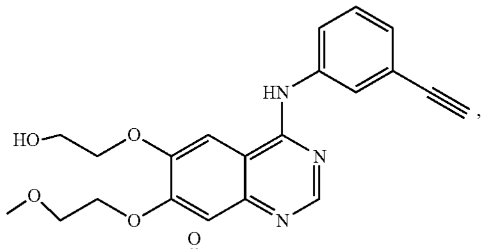

,

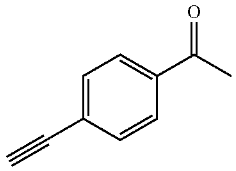

,

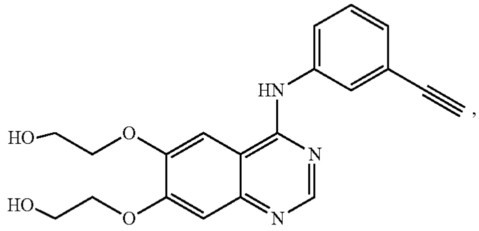

,

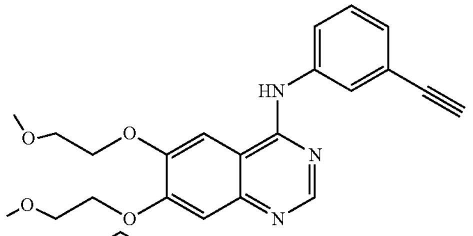

,

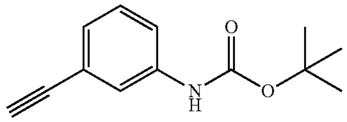

,

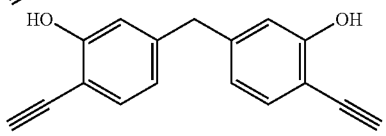

, and

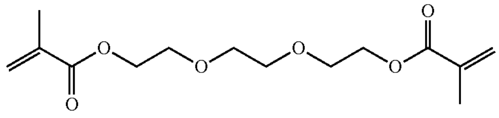

.

The present invention has no particular limitation on the synthesis method of the thermal crosslinking agent. Unless otherwise specified, known methods can be used for synthesis.

The content of the thermal crosslinking agent is not particularly limited. Relative to 100 parts by mass of the total amount of component (a) in the resin composition, the thermal crosslinking agent is preferably 10 to 40 parts by mass, more preferably 12 to 35 parts by mass, further preferably 14 to 30 parts by mass, particularly preferably 16 to 26 parts by mass. The ratio of the part by mass of (b1) to the part by mass of (b2) is preferably 25:1 to 5:1, more preferably 22:1 to 8:1, and further preferably 20:1 to 10:1.

(c) Photosensitizer

Photosensitizer (c) contained in the resin composition of the present invention is not particularly limited. For the photosensitizer, a photopolymerization initiator and/or a photoacid generator that absorbs a specific wavelength and then decomposes to produce free radicals can be used. In the present invention, a photoacid generator is preferred.

As the photoacid generator of photosensitizer in the resin composition, a quinone diazide compound, a sulfonium salt, a phosphonium salt, a diazonium salt, an iodonium salt, etc., can be listed. In terms of the long-term reliability of an organic EL device, a photoacid generator containing a quinone diazide compound is preferred.

As the quinone diazide compound, a compound obtained by bonding a sulfonic acid of diazidoquinone to a polyhydroxy compound in the form of an ester; a compound obtained by bonding a sulfonic acid of diazidoquinone to a polyamine compound in the form of a sulfamide; a compound obtained by bonding a sulfonic acid of diazidoquinone to a polyhydroxypolyamine compound in the form of an ester and/or a sulfamide, etc. can be listed. All functional groups of these polyhydroxy compounds, polyamino compounds and polyhydroxy polyamino compounds may not be completely replaced by diazidoquinone, and it is preferred that 40 mol % or more of the overall functional groups are replaced by diazidoquinone on average. By containing such a quinone diazide compound, the affinity of the quinone diazide compound to an alkaline aqueous solution is reduced, the ratio of the dissolution rate of the exposed part to the unexposed part of the composition is increased, so that the pattern can be obtained with a high resolution, and a positive photosensitive resin precursor composition with photosensitivity to i-ray (wavelength 365 nm), h-ray (wavelength 405 nm) and g-ray (wavelength 436 nm) of a common mercury lamp for ultraviolet light can be obtained.

The present invention has no particular limitation on the type and synthesis method of the quinone diazide compound as the photosensitizer. Unless otherwise specified, known quinone diazide compounds and synthesis methods therefor can be used. The quinone diazide compounds can be used alone or in combination. Therefore, the ratio of the dissolution rate of the exposed part to the unexposed part can be further increased, and a highly sensitive photosensitive resin precursor composition can be obtained.

The content of the photosensitizer is not particularly limited, and is preferably 10 to 50 parts by mass, more preferably 20 to 40 parts by mass relative to 100 parts by mass of the total amount of component (a) in the resin composition. By setting the content of the photosensitizer in this range, a high sensitivity can be realized, and a sensitizer can be further contained as needed.

In addition to polymer (a), thermal crosslinking agent (b) and photosensitizer (c), the resin composition of the present invention can also contain the following additives.

(d) Solvent

The resin composition of the present invention may also include an organic solvent. By adding a solvent, the three components (a), (b) and (c) can be fully and evenly dispersed, and each component can be dissolved in the solvent and prepared into a varnish form, so as to further improve the properties, like coating properties etc., of the resin composition.

As the organic solvent in the resin composition, there is no particular limitation. Compounds of ethers, acetate esters, esters, ketones, aromatic hydrocarbons, amides or alcohols can be listed. More specifically, γ-butyrolactone, ethylene glycol monomethyl ether, ethylene glycol monoethyl ether, ethylene glycol mono-n-propyl ether, ethylene glycol mono-n-butyl ether, diethylene glycol monomethyl ether, diethylene glycol, monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene ether, tetrahydrofuran, dioxane, acetone, methyl ethyl ketone, diisobutyl ketone, cyclohexanone, 2-heptanone, 3-heptanone, diacetone alcohol, ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, ethyl lactate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methoxybutyl acetate, methoxybutyl 3-methyl-3-acetate, 3-methyl-3-methoxybutyl propionate, ethyl acetate, n-propyl acetate, isopropyl acetate, n-butyl acetate, isobutyl acetate, n-amyl formate, isoamyl acetate propyl valerate n-butyl ester, ethyl butyrate, n-propyl butyrate, butyrate isobutyric acid, n-butyl butyrate, methyl pyruvate, ethyl pyruvate, n-propyl pyruvate, methyl acetoacetate, ethyl acetoacetate, ethyl 2-oxobutanate, aromatic compounds (such as toluene and/or xylene), amides (such as one or more of hydrocarbyl, N-methylpyrrolidone, N,N-dimethylformamide and N,N-dimethylacetamide) can be listed. One or more thereof can be contained.

The content of the solvent is not particularly limited. In order to dissolve the composition, it is preferably 100 to 2000 parts by mass, more preferably 300 to 1700 parts by mass, further preferably 400 to 1200 parts by mass, particularly preferably 600 to 1100 parts by mass relative to 100 parts by mass of the total amount of component (a), except the solvent, in the resin composition. According to the requirements of the coating process, resin composition solutions with different viscosities can be prepared by adjusting the content of the polymer, and a resin film with excellent performance can be obtained in a better fashion; preferably, the viscosity of the resin composition solution ranges from 0.1 to 12000 cP, further preferably 0.5 to 10000 cP, and more preferably 1 to 8000 cP.

(e) Endcapping Agent

For the resin composition, in order to adjust the molecular weight to a preferred range, the two ends can be terminated with an end-capping agent. As an endcapping agent for a reaction with the acid dianhydride compound, monoamines and monohydric alcohols can be listed. In addition, as an endcapping agent for a reaction with the diamine compound, anhydrides, monocarboxylic acids, monoacid chloride compounds, monoactive ester compounds, dicarbonate compounds, vinyl ether compounds, etc. can be listed. In view of the end capping effect and heat resistance, it is preferable that the end-capping agent contains an aromatic functional group. In addition, by obtaining other good effects, various functional organic groups can also be introduced into the endcapping agent as terminal groups. For example, the introduction of alkali-soluble functional groups such as hydroxyl, carboxyl, etc., can improve the alkali-soluble properties thereof; and the introduction of unsaturated bonds can improve the thermal crosslinking properties, etc., thereof. It is further preferred that the introduced functional organic groups are connected to an aromatic ring in the end-capping agent to obtain a better performance.

The content of the endcapping agent is not particularly limited, and is preferably 0.1 to 20 parts by mass, more preferably 0.8 to 15 parts by mass, and further more preferably 1.0 to 10 parts by mass relative to 100 parts by mass of the total amount of component (a) in the resin composition. By setting the content of the endcapping agent in this range, a good endcapping effect can be obtained without excessive organic matter remaining in the resin composition.

(f) Phenolic Hydroxyl Compound

As the additive in the resin composition of the present invention, a compound with a phenolic hydroxyl group can also be included. By containing the compound with a phenolic hydroxyl group, the alkali solubility of the polymer can be better improved, and the development time can thus be shortened. In detail, the resin composition obtained using the compound containing a phenolic hydroxyl group is basically insoluble in an alkaline developing liquid before exposure, and if being exposed, the resin composition is easily dissolved in the alkaline developing liquid and easily develops in a short time. Therefore, the film loss caused by development is small. Therefore, a finer concave-convex graphic can be obtained.

As such phenolic hydroxyl compounds, in addition to the varieties of the above-mentioned compounds containing a phenolic hydroxyl group, Bis-Z, BisOC-Z, BisOPP-Z, BisP-CP, Bis26X-Z, BisOTPB-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTPB-CP, TekP-4HBPA, TrisP-HAP, TrisP-PA, BisOFP-Z, BisRS-2P, BisPG-26X, BisRS-3P, BisOC-OCHP, BisPG-26X, BisPC-OCHP, Bis26X-OCHP, BisPG-26X, BisOCHP-OC, Bis236T-OCHP, BisRS-26X. BIR-OC, BIP-PC, BIR-PC, BIR-PTBP, BIR-PCHP, BIP-BIOC-F, BIR-BIPC-F, TEP-BIP-A, etc., can be listed; and Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, BisRS-26X, BIP-PC, BIR-PC, BIR-PTBP and BIR-BIPC-F are preferred. One or more thereof can be contained. Other structures or substances bearing phenolic hydroxyl groups, as mentioned in the present invention, can also exist as phenolic hydroxyl compounds.

In view of the heat resistance of phenolic hydroxyl compounds, bisphenols are preferred. The content of the phenolic hydroxyl compound is preferably 1 to 50 parts by mass relative to 100 parts by mass of the total amount of the resin composition. Thus, the performance of the alkaline development of the photosensitive resin precursor composition can be improved while the performance of the high heat resistance can be maintained.

The resin composition of the present invention can also include at least one or two or more of polyamide, polyimide, a polyimide precursor, polybenzoxazole, a polybenzoxazole precursor, or copolymers thereof.

<Preparation of Resin Composition>

The first step is the synthesis of a polymer. First, a diamine and an acid dianhydride, which are required by the present invention, are respectively charged into a solvent, and a polymerization reaction is carried out at −20° C. to 150° C. under stirring for 1 to 10 hours, during which an endcapping agent is added to form polymer (a) with the target molecular weight. An esterifying agent is then added to the solution system for a reaction for 1 minute to 3 hours, and finally, the polymer is charged into water to obtain the target polymer.

In view of dissolution homogeneity, the range of the molecular weight of polymer (a) is preferably 5000 to 500000, further preferably 8000 to 350000, and further more preferably 10000 to 250000.

As the diamine and/or acid dianhydride of the present invention, in addition to the diamines and/or acid dianhydrides mentioned above, combination with other common diamines and/or acid dianhydrides is also possible, with the purpose to adjust the performance of the polymer so as to obtain a resin film with more excellent performance.

As an esterifying agent, it is not particularly limited. Unless otherwise specified, it can be synthesized by using known methods. Specific examples can include:

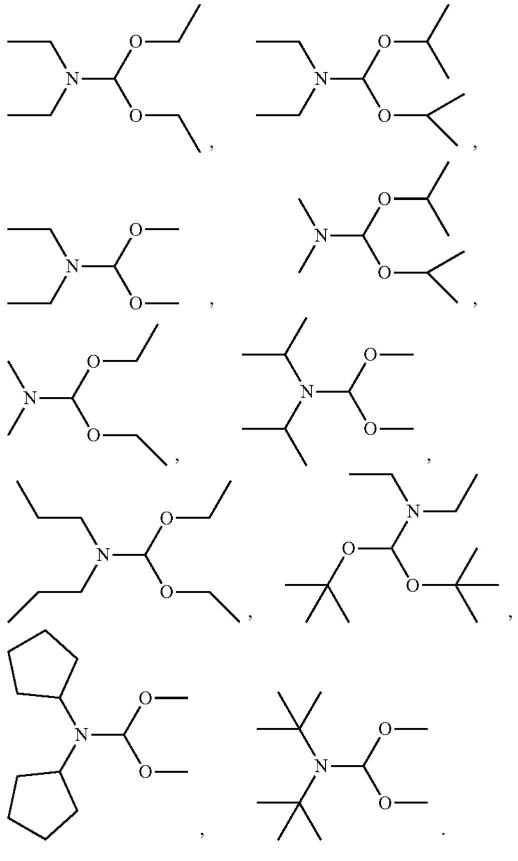

In view of the esterification effect and the performance of forming a resin film, an esterifying agent with a relatively small molecular weight is preferred to form an esterification protective group with a small molecular weight. The esterifying agent is preferably selected from compounds with the following structures:

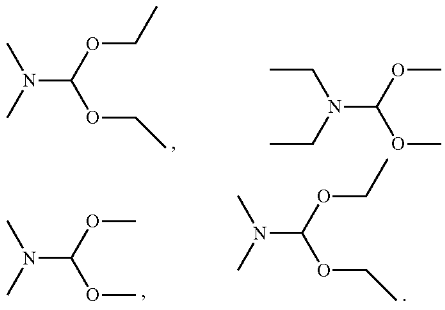

The solvent used during the polymerization process is not particularly limited, as long as it can dissolve acid dianhydrides and diamines which act as raw material monomers. Specifically, amides such as N,N-dimethylformamide, N,N-dimethylacetamide, N-methyl-2-pyrrolidone, 1,3-dimethyl-2-imidazolinone. N,N'-dimethylacrylurea, N,N-dimethylisobutyramide, and methoxy-N,N-dimethylpropionamide; cyclic esters such as γ-butyrolactone, γ-pentalactone, δ-pentalactone, γ-caprolactone, ε-caprolactone, and α-methyl-γ-butyrolactone; carbonates such as ethylene carbonate and propylene carbonate; diols such as triethylene glycol; phenols such as m-cresol and p-cresol; acetophenone, sulfolane, dimethyl sulfoxide, tetrahydrofuran, dimethyl sulfoxide, propylene glycol monomethyl ether acetate, ethyl lactate, etc., can be listed.

The second step is the preparation of a varnish. First, the obtained target polymer is added to a solvent to dissolve, and thermal crosslinking agent (b) and photosensitizer (c) are then added to the solution system. According to other functional requirements, some other additives may also be added, for example, a phenolic hydroxyl compound is added to improve the performance of the alkaline solubility, to finally obtain a varnish, also known as a resin composition. In view of the stability of the varnish, the content is preferably 5% to 55%, further preferably 6% to 35%, further more preferably 7% to 25%, and even further preferably 8% to 15%. In view of the coating performance, preferably, the viscosity of the resin composition solution ranges from 0.1 to 12000 cP, further preferably 0.5 to 10000 cP, and further more preferably 1 to 8000 cP.

<Resin Film>

The resin film of the present invention can be prepared from the above-mentioned resin composition. Specifically, the resin composition can be applied on a substrate, and subjected to drying, exposure, development, and heat treatment and curing to obtain a resin film with a fixed pattern, which is called a photosensitive resin film. The exposure and development processes may also not be carried out to directly obtain an ordinary resin film. If the ordinary resin film is further laminated, a protective film can be formed.

As the substrate, silicon wafers, ceramics, gallium arsenide, organic circuit substrates, inorganic circuit substrates, substrates obtained by configuring circuit constituent materials on such substrates, etc., can be used, and the substrate are not limited thereto.

The coating method can include a spin coating method, a slit coating method, a dip coating method, a spraying method, a printing method, etc., and the slit coating method is preferred.

The drying method can be one of or a combination of some of an oven, a heating plate or an infrared method. The heating temperature is preferably 50° C. to 180° C., and the heating time is preferably more than 30 seconds.

The exposure method involves covering the dried resin composition with a mask with a desired pattern, and performing irradiation with chemical rays for exposure. The chemical rays used for exposure include ultraviolet rays, visible rays, electron ray, X-ray, etc., and i-ray (365 nm), h-ray (405 nm) and g-ray (436 nm) of a mercury lamp are preferably used in the present invention. In order to form the heat-resistant resin pattern, the exposed part is removed by means of a developing liquid after exposure. After development, a photosensitive resin film can be obtained by means of heating and curing. The developing liquid can be a commonly known developing liquid, and the developing method can also be a commonly known method.

The heat treatment and curing method can be a method in which one of and/or a combination of some of an oven, a heating plate and an infrared ray method. In view of the flatness degree, the heat treatment stage is divided into a first stage and a second stage, wherein during the heat treatment and curing in the first stage, the curing temperature is 120° C. to 180° C., and the curing time is 2 minutes to 4 hours; in this heat treatment and curing stage, the aromatic ester thermal crosslinking agent as thermal crosslinking agent (b1) initiates a major crosslinking reaction; and by means of the heat treatment and curing in the first stage, the resin film can be pre-crosslinked to a controllable extent to reduce the deformation of the resin film caused by the crosslinking reaction; and then, during the heat treatment and curing in the second stage, the curing temperature is 180° C. to 400° C., and the curing time is 2 minutes to 4 hours; in this heat treatment and curing stage, the thermal crosslinking agent containing unsaturated bonds as thermal crosslinking agent (b2) initiates a major crosslinking reaction; by means of the heat treatment and curing in the second stage, the resin film can be further crosslinked and cured to form a stable resin film; and due to the crosslinking reaction in the first stage, the crosslinking reaction in the second stage will not be very intense, thereby effectively controlling the huge deformation of the resin film after development due to the heat treatment and curing, thereby better controlling the flatness degree of the photosensitive resin film after the heat treatment and curing. In view of the flatness degree of the obtained photosensitive resin film, in the heat treatment and curing conditions in the second stage, the maximum temperature is preferably below 380° C., further preferably below 350° C.; and it is also preferable that during the temperature programing, it is preferable to raise the temperature gently in multiple stages.

The resin film of the present invention, which includes a photosensitive resin film, an ordinary resin film and a protective film, can not only be applied to organic EL display devices, but also to electronic components such as semiconductor devices, and multilayer wiring boards. In order to obtain a good device performance, the thickness of the resin film is preferably 0.4 to 25 μm, more preferably 1.0 to 18 μm, and further preferably 1.5 to 12 μm.

<Display Device>

The present invention also provides a display device. Specifically, the ordinary resin film and/or the photosensitive resin film and/or the protective film obtained from the resin composition according to the present invention can be used for a planarization layer and/or insulation layer in an organic EL display device that has a drive circuit, the planarization layer, a first electrode, the insulation layer, a light-emitting layer and a second electrode on a substrate. An organic EL display device with long-term reliability and excellent bending recovery performance can be obtained.

The display device of the present invention can realize bending and folding in an appropriate manner. For example, it can be bent either at the central part of the photosensitive device or at an end of the photosensitive device, and according to the specific use and basic configuration, multiple instances of bending can be realized in specific parts of the display device, and the long-term effective display characteristic can be maintained.

EXAMPLES

Examples are listed below to illustrate the present invention, but the present invention is not limited thereto. First, abbreviations corresponding to some monomers involved in the examples are explained.

Compound 1: Diamine 5 (3,3'-dihydroxy benzidine. CAS No.: 2373-98-0)

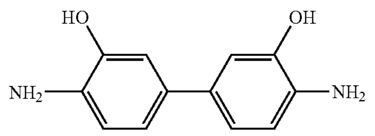 [SMILES: Nc1ccc(-c2ccc(N)c(O)c2)cc1O]

Compound 2: Acid dianhydride 1 (4,4'-oxydiphthalic anhydride, CAS No.: 1823-59-2)

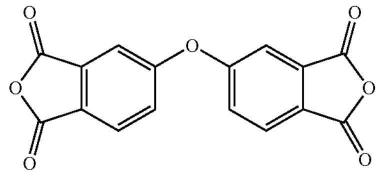 [SMILES: O=C1OC(=O)c2cc(Oc3ccc4c(c3)C(=O)OC4=O)ccc21]

Compound 3: Acid dianhydride 2 (hexafluorodianhydride, CAS No.:1107-00-2)

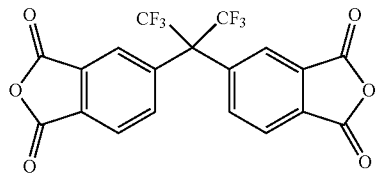 [SMILES: O=C1OC(=O)c2cc(C(c3ccc4c(c3)C(=O)OC4=O)(C(F)(F)F)C(F)(F)F)ccc21]

Compound 4: Acid dianhydride 3 (p-phenylene-bis(trimellitate) dianhydride, CAS No.: 277(>-49-2)

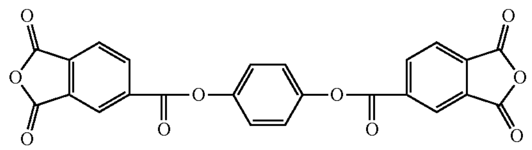 [SMILES: O=C(Oc1ccc(OC(=O)c2ccc3c(c2)C(=O)OC3=O)cc1)c1ccc2c(c1)C(=O)OC2=O]

Compound 5: Acid dianhydride 4 (3,3,4,4-diphenylsulfone-tetracarboxylic dianhydride, CAS No.: 2540-99-0)

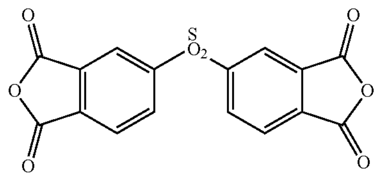 [SMILES: O=C1OC(=O)c2cc(S(=O)(=O)c3ccc4c(c3)C(=O)OC4=O)ccc21]

Compound 6: Acid dianhydride 5 (4,4'-(p-phenylenedioxy)bis(phthalic anhydride), CAS No.: 17828-534)

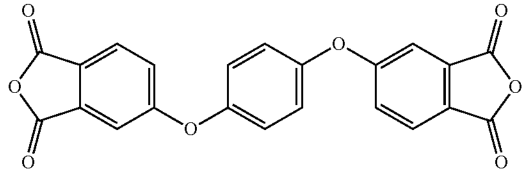 [SMILES: O=C1OC(=O)c2cc(Oc3ccc(Oc4ccc5c(c4)C(=O)OC5=O)cc3)ccc21]

Compound 7: Acid dianhydride 6 (3.3',4,4'-biphenyl tetracarboxylic dianhydride, CAS No.: 2420-87-3)

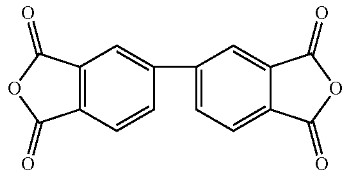 [SMILES: O=C1OC(=O)c2cc(-c3ccc4c(c3)C(=O)OC4=O)ccc21]

Compound 8: Thermal crosslinking agent (b1)-1 (4,4',4"-(ethane-1,1,1-triyl)tris(2,6-bis(methoxymethyl)phenol), CAS No.: 672926-26-0)

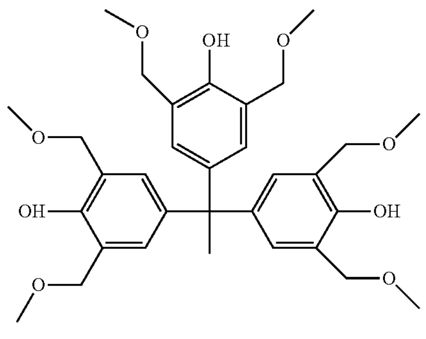

Compound 9: Thermal crosslinking agent (b2)-1 (polydipentaerythritol hexaacrylate, CAS No.: 29570-58-9)

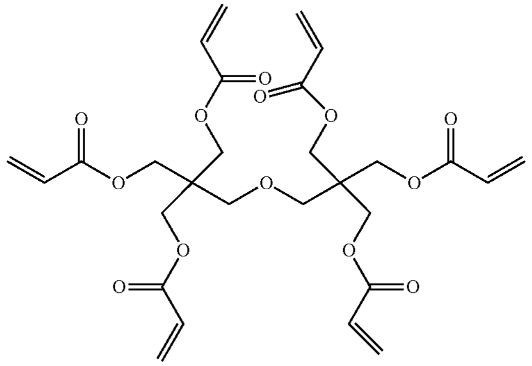 [SMILES: C=CC(=O)OCC(COCC(COC(=O)C=C)(COC(=O)C=C)COC(=O)C=C)(COC(=O)C=C)COC(=O)C=C]

Compound 10: Thermal crosslinking agent (b2)-2 ((methyl-1,3-phenylene)bis[iminoformyloxy[2,2-bis[[(1-oxoallyl)oxy]methyl]]-3,1-propanediyl]diacrylate. CAS No.: 51160-64-6)

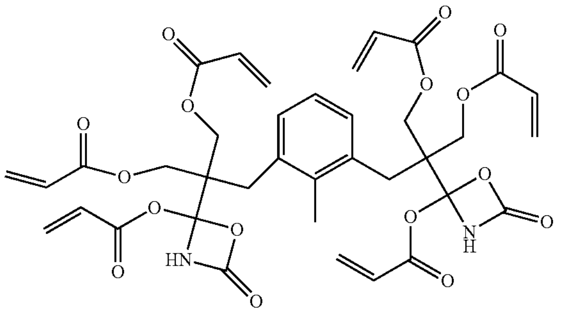 [SMILES: C=CC(=O)OCC(COC(=O)C=C)(Cc1cccc(CC(COC(=O)C=C)(COC(=O)C=C)C2(OC(=O)C=C)NC(=O)O2)c1C)C1(OC(=O)C=C)NC(=O)O1]

Compound 11: Thermal crosslinking agent (b2)-3 (4-(triisopropylsilylacetenyl)phenylacetylene. CAS No.: 75345-90-1)

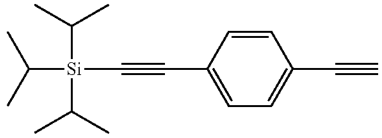 [SMILES: C#Cc1ccc(C#C[Si](C(C)C)(C(C)C)C(C)C)cc1]

Compound 12: Siloxane compound 1 (SiDA, CAS No.: 2469-55-8)

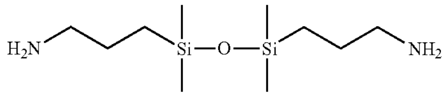

Compound 13: Siloxane compound 2 (2,2'-(1,1-diethyl-3,3-dimethyldisiloxane-1,3-diyl)bis(ethane-1-amine), CAS No.: 2152657-68-4)

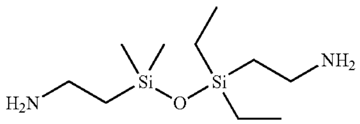

Compound 14: Esterifying agent 1 (N,N-dimethylformamide diethyl acetal, CAS No.:1188-33-6)

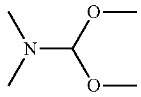

Compound 15: End-capping agent 1 (MAP, CAS No.: 591-27-5)

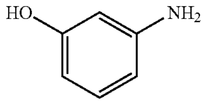

Compound 16: End-capping agent 2 (4-ethynylaniline, CAS No.:14235-81-5)

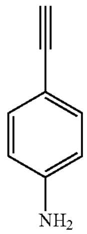

Compound 17: Solvent 1 (NMP, CAS No.: 872-50-4)
Compound 18: Solvent 2 (GBL, CAS No.: 96-48-0)

Synthesis Example 1

Diamine 1: N,N'-((perfluoropropane-2,2-diyl)bis(6-hydroxy-3,1-phenylene)bis(3-aminobenzamide)

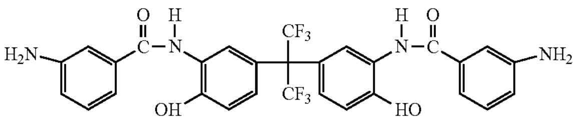 [SMILES: Nc1cccc(C(=O)Nc2cc(C(c3ccc(O)c(NC(=O)c4cccc(N)c4)c3)(C(F)(F)F)C(F)(F)F)ccc2O)c1]

step 1: To a 1 L reaction flask, 22 g (0.06 mol) of 2,2-bis(3-amino-4-hydroxyphenyl)hexafluoropropane, 20.91 g (0.36 mol) of propylene oxide and 120 mL of acetone were added and stirred at room temperature until completely dissolved, and the reaction system was then cooled to −15° C. Then, 120 ml of an acetone solution of 24.49 g (0.132 mol) of m-nitrobenzoyl chloride was added thereto, and after the dropwise addition was completed, the mixture was kept under stirring at −15° C. for 5 hours and then naturally warmed to room temperature. The obtained reaction solution was filtered under reduced pressure to obtain an off-white solid, and the solid was dried in a vacuum oven at 60° C. for 20 hours.

step 2: 20 g (0.03 mol) of the obtained off-white solid, 2.58 g of 5% palladium on carbon and 170 mL of ethylene glycol methyl ether were added to a 500 mL high-pressure reactor, the high-pressure reactor was displaced with hydrogen and pressurized with hydrogen to make the pressure in the reactor reach 10 kgf/cm$^2$, and stirring was carried out at 35° C. for 2 hours. Then, the pressure was slowly released, and the reaction solution was filtered under reduced pressure to obtain a transparent solution. Ethanol and petroleum ether were added to the solution, stirred for 6 hours and filtered to obtain a white solid. The solid was dried in a vacuum oven at 50° C. for 20 hours to obtain diamine 1, i.e. N,N'-((perfluoropropane-2,2-diyl)bis(6-hydroxy-3,1-phenylene) bis(3-aminobenzamide).

Synthesis Example 2

Diamine 2: N,N'-((perfluoropropane-2,2-diyl)bis(5-hydroxy-3,1-phenylene)bis(3-aminobenzamide)

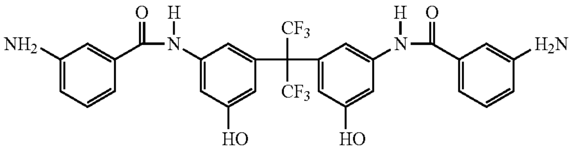 [SMILES: Nc1cccc(C(=O)Nc2cc(O)cc(C(c3cc(O)cc(NC(=O)c4cccc(N)c4)c3)(C(F)(F)F)C(F)(F)F)c2)c1]

step 1: To a 1 L reaction flask, 22 g (0.06 mol) of 2,2-bis(3-amino-5-hydroxyphenyl)hexafluoropropane, 20.91 g (0.36 mol) of propylene oxide and 120 mL of acetone were added and stirred at room temperature until completely dissolved, and the reaction system was then cooled to −15° C. Then, a solution of 24.49 g (0.132 mol) of 3-nitrobenzoyl chloride in acetone (120 ml) was slowly dropwise added thereto, and after the dropwise addition was completed, the mixture was kept under stirring at −15° C. for 5 hours and then naturally warmed to room temperature. The obtained reaction solution was filtered under reduced pressure to obtain an off-white solid, and the solid was dried in a vacuum oven at 60° C. for 20 hours.

step 2: 20 g (0.03 mol) of the obtained off-white solid, 2.58 g of 5% palladium on carbon and 170 ml of ethylene glycol methyl ether were added to a 500 mL high-pressure reactor, the high-pressure reactor was displaced with hydrogen and pressurized with hydrogen to make the pressure in the reactor reach 10 kgf/cm2, and stirring was carried out at 35° C. for 2 hours. Then, the pressure was slowly released and the reaction solution was filtered under reduced pressure to obtain a transparent solution. Ethanol and petroleum ether were added to this solution, stirred for 6 hours to separate out a solid precipitate, and filtered to obtain a white solid. The solid was dried in a vacuum oven at 50° C. for 20 hours to obtain diamine 2. i.e. N,N'-((perfluoropropane-2,2-diyl)bis (5-hydroxy-3,1-phenylene)bis(3-aminobenzamide).

Synthesis Example 3

Diamine 3: N,N'-(oxybis(6-hydroxy-5-(trifluoromethyl)-3,1-phenylene)bis(3-aminobenzamide)

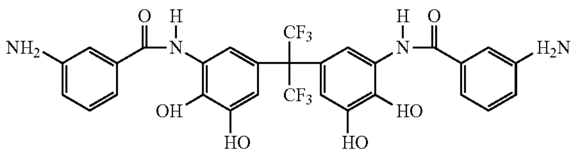 [SMILES: Nc1cccc(C(=O)Nc2cc(C(c3cc(O)c(O)c(NC(=O)c4cccc(N)c4)c3)(C(F)(F)F)C(F)(F)F)cc(O)c2O)c1]

step 1: To a 1 L reaction flask, 22.1 g (0.06 mol) of bis(3-trifluoromethyl-4-hydroxy-5-amino)phenylether, 20.91 g (0.36 mol) of propylene oxide and 120 mL of acetone were added and stirred at room temperature until completely dissolved, and the reaction system was then cooled to −15° C. Then, a solution of 24.49 g (0.132 mol) of 3-nitrobenzoyl chloride in acetone (120 ml) was slowly dropwise added thereto, and after the dropwise addition was completed, the mixture was kept under stirring at −15° C. for 5 hours and then naturally warmed to room temperature. The obtained reaction solution was filtered under reduced pressure to obtain an off-white solid, and the solid was dried in a vacuum oven at 60° C. for 20 hours.

step 2: 20 g (0.03 mol) of the obtained off-white solid, 2.58 g of 5% palladium on carbon and 170 mL of ethylene glycol methyl ether were added to a 500 mL high-pressure reactor, the high-pressure reactor was displaced with hydrogen and pressurized with hydrogen to make the pressure in the reactor reach 10 kgf/cm2, and stirring was carried out at 35° C. for 2 hours. Then, the pressure was slowly released, and the reaction solution was filtered under reduced pressure to obtain a transparent solution. Ethanol and petroleum ether were added to the solution, stirred for 6 hours to separate out a solid precipitate, and filtered to obtain a white solid. The solid was dried in a vacuum oven at 50° C. for 20 hours to obtain diamine 3. i.e. N,N'-(oxybis(6-hydroxy-5-(trifluoromethyl)-3,1-phenylene))bis(3-aminobenzamide).

Synthesis Example 4

Diamine 4: 5,5'-(perfluoropropane-2,2-diyl)bis(2-(4-aminophenoxy)phenol)

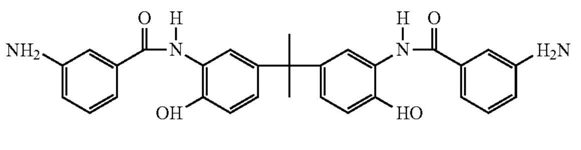 [SMILES: CC(C)(c1ccc(O)c(NC(=O)c2cccc(N)c2)c1)c1ccc(O)c(NC(=O)c2cccc(N)c2)c1]

step 1: To a 1 L reaction flask, 15.5 g (0.06 mol) of 2,2-bis(3-amino-4-hydroxyphenyl)dimethylpropane, 20.91 g (0.36 mol) of propylene oxide and 140 mL of acetone were added and stirred at room temperature until completely dissolved, and the reaction system was then cooled to −15° C. Then, a solution of 24.49 g (0.132 mol) of m-nitrobenzoyl chloride in 140 ml of acetone was slowly dropwise added thereto, and after the dropwise addition was completed, the mixture was kept under stirring at −15° C. for 5 hours and then naturally warmed to room temperature. The obtained reaction solution was filtered under reduced pressure to obtain a white solid, and the solid was dried in a vacuum oven at 60° C. for 20 hours.

step 2: 14.9 g (0.03 mol) of the obtained white solid, 2.58 g of 5% palladium on carbon and 170 mL of ethylene glycol methyl ether were added to a 500 mL high-pressure reactor, the high-pressure reactor was displaced with hydrogen and pressurized with hydrogen to make the pressure in the reactor reach 10 kgf/cm2, and stirring was carried out at 40° C. for 2 hours. Then, the pressure was slowly released, and the reaction solution was filtered under reduced pressure to obtain a transparent solution. Ethanol and petroleum ether were added to the solution, stirred for 6 hours to separate out a solid, and filtered to obtain a white solid. The solid was dried in a vacuum oven at 50° C. for 20 hours to obtain diamine 4, i.e. 5,5'-(perfluoropropane-2,2-diyl)bis(2-(4-aminophenoxy)phenol).

Synthesis Example 5

Photosensitizer 1: Diazidonaphthoquinone Compound

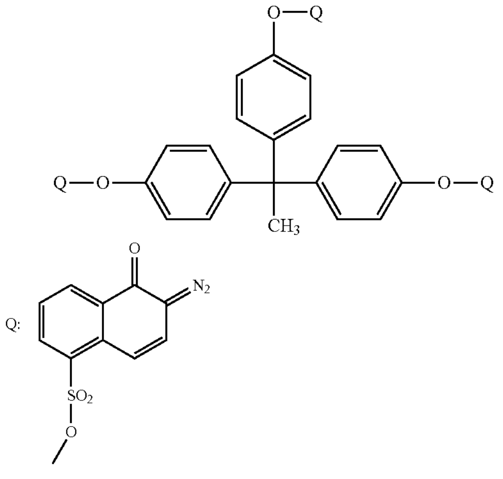

Under the condition that the system was under nitrogen protection, 30.6 g of 1,1,1-tris(4-hydroxyphenyl)ethane and 80.5 g of 5-diazidonaphthoquinone sulfonyl chloride solution were added to 1,4-dioxane, the reaction system was warmed to 30° C., a mixed solution of 100 g of 1,4-dioxane and 13.3 g of triethylamine was added dropwise, the system was maintained at a temperature of 30° C. and stirred for 3 hours, the reaction solution was filtered to remove triethylamine salt, the filtrate was dropwise added to purified water to separate out a solid, the solution was filtered, and a precipitate was collected and dried in a vacuum oven to give photosensitizer 1, i.e. diazidonaphthoquinone compound.

Synthesis Example 6 Synthesis of Resin (a-1)

Under the condition that the system was under nitrogen protection, 0.09 mol of 5,5'-(perfluoropropane-2,2-diyl)bis (2-(4-aminophenoxy)phenol) (Diamine 4) obtained in Synthesis Example 4 and 0.05 mol of MAP (endcapping agent 1) were dissolved in 500 mL of NMP. After stirred and dissolved, the mixture was heated in an oil bath at 60° C. 0.1 mol of 4,4'-oxydiphthalic anhydride (acid dianhydride 1) was added to the reaction solution in the oil bath and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-1).

Synthesis Example 7 Synthesis of Resin (a-2)

Under the condition that the system was under nitrogen protection, 0.085 mol of N,N'-((perfluoropropane-2,2-diyl) bis(6-hydroxy-3,1-phenylene)bis(3-aminobenzamide) (Diamine 1) obtained in Synthesis Example 1, 0.005 mol of SiDA and 0.05 mol of MAP (endcapping agent 1) were dissolved in 500 mL of NMP. After stirred and dissolved, the mixture was heated in an oil bath at 60° C. 0.1 mol of 4,4'-oxydiphthalic anhydride (acid dianhydride 1) was added to the reaction solution and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-2).

Synthesis Example 8 Synthesis of Resin (a-3)

Under the condition that the system was under nitrogen protection, 0.085 mol of N,N'-((perfluoropropane-2,2-diyl) bis(6-hydroxy-3,1-phenylene)bis(3-aminobenzamide) (Diamine 1) obtained in Synthesis Example 1, 0.005 mol of SiDA and 0.05 mol of MAP (endcapping agent 1) were dissolved in 500 mL of NMP. After stirred and dissolved, the mixture was heated in an oil bath at 60° C. 0.1 mol of hexafluorodianhydride (acid dianhydride 2) was added to the reaction solution and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-3).

Synthesis Example 9 Synthesis of Resin (a-4)

Under the condition that the system was under nitrogen protection, 0.085 mol of N,N'-((perfluoropropane-2,2-diyl) bis(6-hydroxy-3,1-phenylene)bis(3-aminobenzamide) (Diamine 1) obtained in Synthesis Example 1, 0.005 mol of SiDA and 0.05 mol of MAP (endcapping agent 1) were dissolved in 500 mL of NMP. After stirred and dissolved, the mixture was heated in an oil bath at 60° C. 0.1 mol of p-phenylene-bis(trimellitate) dianhydride (acid dianhydride 3) was added to the reaction solution and reacted for 2 hours. Then, 5.0 mol of N,N-dimethylformanide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-4).

Synthesis Example 10 Synthesis of Resin (a-5)

Under the condition that the system was under nitrogen protection, 0.085 mol of N,N'-((perfluoropropane-2,2-diyl) bis(5-hydroxy-3,1-phenylene)bis(3-aminobenzamide) (Diamine 2) in Synthesis Example 2, 0.005 mol of SiDA and 0.05 mol of the endcapping agent MAP (endcapping agent 1) were dissolved in 500 mL of NMP. After stirred and dissolved, the mixture was heated in an oil bath at 60° C. 0.1 mol of 3,3,4,4-diphenylsulfone-tetracarboxylic dianhydride (acid dianhydride 4) was added to the reaction solution and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-5).

Synthesis Example 11 Synthesis of Resin (a-6)

Under the condition that the system was under nitrogen protection, 0.085 mol of N,N'-(oxybis(6-hydroxy-5-(trifluoromethyl)-3,1-phenylene)bis(3-aminobenzamide) (Diamine 3) obtained in Synthesis Example 3, 0.005 mol of SiDA and 0.05 mol of the endcapping agent MAP were dissolved in 500 mL of NMP. After stirred and dissolved, the mixture was heated in an oil bath at 60° C. 0.1 mol of 4,4'-(p-phenylenedioxy)bis(phthalic anhydride) (acid dianhydride 5) was added to the reaction solution and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-6).

Synthesis Example 12 Synthesis of Resin (a-7)

Under the condition that the system was under nitrogen protection, 0.085 mol of 5,5'-(perfluoropropane-2,2-diyl)bis (2-(4-aminophenoxy)phenol) (Diamine 4) obtained in Synthesis Example 4, 0.005 mol of SiDA and 0.05 mol of the endcapping agent MAP were dissolved in 500 mL of NMP. After stirred and dissolved, the mixture was heated in an oil bath at 60° C. 0.1 mol of 4,4'-(p-phenylenedioxy)bis (phthalic anhydride) (acid dianhydride 5) was added to the reaction solution and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-7).

Synthesis Example 13 Synthesis of Resin (a-8)

Under the condition that the system was under nitrogen protection, 0.085 mol of N,N'-((perfluoropropane-2,2-diyl) bis(6-hydroxy-3,1-phenylene)bis(3-aminobenzamide) (Diamine 1) obtained in Synthesis Example 1, 0.005 mol of SiDA and 0.05 mol of 4-ethynylaniline (endcapping agent 2) were dissolved in 500 mL of NMP. After stirred and dissolved, the mixture was heated in an oil bath at 60° C. 0.1 mol of 4,4'-oxydiphthalic anhydride (acid dianhydride 1) was added to the reaction solution and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-8).

Synthesis Example 14 Synthesis of Resin (a-9)

Under the condition that the system was under nitrogen protection, 0.085 mol of N,N'-((perfluoropropane-2,2-diyl) bis(6-hydroxy-3,1-phenylene)bis(3-aminobenzamide) (Diamine 1) obtained in Synthesis Example 1, and 0.005 mol of 2,2'-(1,1-diethyl-3,3-dimethyldisiloxane-1,3-diyl)bis(ethane-1-amine) (siloxane compound 2) and 0.05 mol of the endcapping agent MAP were dissolved in 500 mL of NMP. After stirred and dissolved, the mixture was heated in an oil bath at 60° C. 0.1 mol of 4,4'-oxydiphthalic anhydride (acid dianhydride 1) was added to the reaction solution and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry the product at 50° C. for 72 hours to obtain resin (a-9).

Synthesis Example 15 Synthesis of Resin (a-10)

Under the condition that the system was under nitrogen protection, 0.085 mol of 3,3'-dihydroxybenzidine (Diamine 5) and 0.05 mol of the endcapping agent MAP were dissolved in 500 mL of NMP. After stirred and dissolved, the mixture was heated in an oil bath at 60° C. 0.1 mol of 3,3',4,4'-biphenyl tetracarboxylic dianhydride (Acid dianhydride 6) was added to the reaction solution and reacted for 2 hours. Then, 5.0 mol of N,N-dimethylformamide diethyl acetal, an esterifying agent, was added and stirred for 3 hours, the mixture was charged into 2 L of water and filtered, and the product was washed 3 times. A vacuum dryer was used to dry at 50° C. for 72 hours to obtain resin (a-10).

The synthesis proportions for polymer (a) in Synthesis Examples 6-15 were as shown in Table 1.

stirred for 1 hour to obtain slurry 1. The effect of the obtained slurry was evaluated, and the results were as shown in Table 3.

Example 2

10 g of resin (a-2) obtained above in Synthesis Example 7 was weighed and added to 150 g of GBL solvent, 2 g of 4,4',4"-(ethane-1,1,1-triyl)tris(2,6-bis(methoxymethyl)phenol) (thermal crosslinking agent (b1)-1), 0.11 g of polydipentaerythritol hexaacrylate (thermal crosslinking agent (b2)-1) and 3 g of quinone diazide compound, a photosensitizer, were then respectively added, and the mixture was stirred for 1 hour to obtain slurry 2. The effect of the obtained slurry was evaluated, and the results were as shown in Table 3.

Example 3

10 g of alkali-soluble resin (a-2) obtained above in Synthesis Example 7 was weighed and added to 150 g of GBL solvent, then 2 g of 4,4',4"-(ethane-1,1,1-triyl)tris(2,6-bis(methoxymethyl)phenol) (thermal crosslinking agent (b1)-1), 0.11 g of (methyl-1,3-phenylene)bis[iminoformyloxy[2,2-bis[[(1-oxoallyl)oxy]methyl]]-3,1-propanediyl] diacrylate (thermal crosslinking agent (b2)-2) and 3 g of quinone diazide compound, a photosensitizer, were respectively added, and the mixture was stirred for 1 hour to obtain slurry 3. The effect of the obtained slurry was evaluated, and the results were as shown in Table 3.

TABLE 1

| | Diamine | Acid dianhydride | Siloxane compound | Endcapping agent | Esterifying agent | Solvent | Alkali-soluble resin No. |
|---|---|---|---|---|---|---|---|
| Synthesis Example 6 | Diamine 4 0.09 mol | Acid dianhydride 1 0.1 mol | — | MAP 0.05 mol | Esterifying agent 1 5 mol | NMP 500 mL | (a-1) |
| Synthesis Example 7 | Diamine 1 0.085 mol | Acid dianhydride 1 0.1 mol | SiDA 0.005 mol | MAP 0.05 mol | | | (a-2) |
| Synthesis Example 8 | Diamine 1 0.085 mol | Acid dianhydride 2 0.1 mol | SiDA 0.005 mol | MAP 0.05 mol | | | (a-3) |
| Synthesis Example 9 | Diamine 1 0.085 mol | Acid dianhydride 3 0.1 mol | SiDA 0.005 mol | MAP 0.05 mol | | | (a-4) |
| Synthesis Example 10 | Diamine 2 0.085 mol | Acid dianhydride 4 0.1 mol | SiDA 0.005 mol | MAP 0.05 mol | | | (a-5) |
| Synthesis Example 11 | Diamine 3 0.085 mol | Acid dianhydride 5 0.1 mol | SiDA 0.005 mol | MAP 0.05 mol | | | (a-6) |
| Synthesis Example 12 | Diamine 4 0.085 mol | Acid dianhydride 5 0.1 mol | SiDA 0.005 mol | MAP 0.05 mol | | | (a-7) |
| Synthesis Example 13 | Diamine 1 0.085 mol | Acid dianhydride 1 0.1 mol | SiDA 0.005 mol | Endcapping agent 2 0.05 mol | | | (a-8) |
| Synthesis Example 14 | Diamine 1 0.085 mol | Acid dianhydride 1 0.1 mol | Siloxane compound 2 0.005 mol | MAP 0.05 mol | | | (a-9) |
| Synthesis Example 15 | Diamine 5 0.085 mol | Acid dianhydride 6 0.1 mol | — | MAP 0.05 mol | | | (a-10) |

Example 1

10 g of resin (a-1) obtained above in Synthesis Example 6 was weighed and added to 150 g of GBL solvent, 2 g of 4.4',4"-(ethane-1,1,1-triyl)tris(2,6-bis(methoxymethyl)phenol) (thermal crosslinking agent (b1)-1), 0.11 g of polydipentaerythritol hexaacrylate (thermal crosslinking agent (b2)-1) and 3 g of quinone diazide compound, a photosensitizer, were then respectively added, and the mixture was Example 4

10 g of resin (a-3) obtained above in Synthesis Example 8 was weighed and added to 150 g of GBL solvent, 2 g of 4,4',4"-(ethane-1,1,1-triyl)tris(2,6-bis(methoxymethyl)phenol) (thermal crosslinking agent (b1)-1), 0.11 g of polydipentaerythritol hexaacrylate (thermal crosslinking agent (b2)-1) and 3 g of quinone diazide compound, a photosensitizer, were then respectively added, and the mixture was stirred for 1 hour to obtain slurry 4. The effect of the obtained slurry was evaluated, and the results were as shown in Table 3.

Example 5

10 g of resin (a-4) obtained above in Synthesis Example 9 was weighed and added to 150 g of GBL solvent, 2 g of 4,4',4"-(ethane-1,1,1-triyl)tris(2,6-bis(methoxymethyl)phenol) (thermal crosslinking agent (b1)-1), 0.11 g of polydipentaerythritol hexaacrylate (thermal crosslinking agent (b2)-1) and 3 g of quinone diazide compound, a photosensitizer, were then respectively added, and the mixture was stirred for 1 hour to obtain slurry 5. The effect of the obtained slurry was evaluated, and the results were as shown in Table 3.

Example 6

10 g of resin (a-5) obtained above in Synthesis Example 10 was weighed and added to 150 g of GBL solvent, then 2 g of 4,4',4"-(ethane-1,1,1-triyl)tris(2,6-bis(methoxymethyl) phenol) (thermal crosslinking agent (b1)-1), 0.11 g of (methyl-1,3-phenylene)bis[iminoformyloxy[2,2-bis[[(1-oxoallyl)oxy]methyl]]-3,1-propanediyl]diacrylate (thermal crosslinking agent (b2)-2) and 3 g of quinone diazide compound, a photosensitizer, were respectively added, and the mixture was stirred for 1 hour to obtain slurry 6. The effect of the obtained slurry was evaluated, and the results were as shown in Table 3.

Example 7

10 g of resin (a-6) obtained above in Synthesis Example 11 was weighed and added to 150 g of GBL solvent, 2 g of 4,4',4"-(ethane-1,1,1-triyl)tris(2,6-bis(methoxymethyl)phenol) (thermal crosslinking agent (b1)-1), 0.11 g of polydipentaerythritol hexaacrylate (thermal crosslinking agent (b2)-1) and 3 g of quinone diazide compound, a photosensitizer, were then respectively added, and the mixture was stirred for 1 hour to obtain slurry 7. The effect of the obtained slurry was evaluated, and the results were as shown in Table 3.

Example 8

10 g of resin (a-7) obtained above in Synthesis Example 12 was weighed and added to 150 g of GBL solvent, then 2 g of 4,4',4"-(ethane-1,1,1-triyl)tris(2,6-bis(methoxymethyl) phenol) (thermal crosslinking agent (b1)-1), 0.11 g of (methyl-1,3-phenylene)bis[iminoformyloxy[2,2-bis[[(1-oxoallyl)oxy]methyl]]]-3,1-propanediyl]diacrylate (thermal crosslinking agent (b2)-2) and 3 g of quinone diazide compound, a photosensitizer, were respectively added, and the mixture was stirred for 1 hour to obtain slurry 8. The effect of the obtained slurry was evaluated, and the results were as shown in Table 3.

Example 9

10 g of resin (a-7) obtained above in Synthesis Example 12 was weighed and added to 150 g of GBL solvent, 2 g of 4,4',4"-(ethane-1,1,1-triyl)tris(2,6-bis(methoxymethyl)phenol) (thermal crosslinking agent (b1)-1), 0.11 g of polydipentaerythritol hexaacrylate (thermal crosslinking agent (b2)-1) and 3 g of quinone diazide compound, a photosensitizer, were then respectively added, and the mixture was stirred for 1 hour to obtain slurry 9. The effect of the obtained slurry was evaluated, and the results were as shown in Table 3.

Example 10

10 g of resin (a-8) obtained above in Synthesis Example 13 was weighed and added to 150 g of GBL solvent, 2 g of 4,4',4"-(ethane-1,1,1-triyl)tris(2,6-bis(methoxymethyl)phenol) (thermal crosslinking agent (b1)-1), 0.11 g of 4-(triisopropylsilylacetenyl)phenylacetylene (thermal crosslinking agent (b2)-3) and 3 g of quinone diazide compound, a photosensitizer, were then respectively added, and the mixture was stirred for 1 hour to obtain slurry 10. The effect of the obtained slurry was evaluated, and the results were as shown in Table 3.

Example 11

10 g of resin (a-9) obtained above in Synthesis Example 14 was weighed and added to 150 g of GBL solvent, 2 g of 4,4',4"-(ethane-1,1,1-triyl)tris(2,6-bis(methoxymethyl)phenol) (thermal crosslinking agent (b1)-1), 0.11 g of 4-(triisopropylsilylacetenyl)phenylacetylene (thermal crosslinking agent (b2)-3) and 3 g of quinone diazide compound, a photosensitizer, were then respectively added, and the mixture was stirred for 1 hour to obtain slurry 11. The effect of the obtained slurry was evaluated, and the results were as shown in Table 3.

Comparative Example 1

10 g of resin (a-10) obtained above in Synthesis Example 15 was weighed and added to 150 g of GBL solvent, 2 g of 4,4',4"-(ethane-1,1,1-triyl)tris(2,6-bis(methoxymethyl)phenol) (thermal crosslinking agent (b1)-1), 0.11 g of polydipentaerythritol hexaacrylate (thermal crosslinking agent (b2)-1) and 3 g of quinone diazide compound, a photosensitizer, were then respectively added, and the mixture was stirred for 1 hour to obtain slurry 12. The effect of the obtained slurry was evaluated, and the results were as shown in Table 3.

Comparative Example 2

10 g of resin (a-2) obtained above in Synthesis Example 7 was weighed and added to 150 g of GBL solvent, 2.11 g of 4,4',4"-(ethane-1,1,1-triyl)tris(2,6-bis(methoxymethyl) phenol) (thermal crosslinking agent (b1)-1) and 3 g of quinone diazide compound, a photosensitizer, were then added, and the mixture was stirred for 1 hour to obtain slurry 13. The effect of the obtained slurry was evaluated, and the results were as shown in Table 3.

Comparative Example 3

10 g of alkali-soluble resin (a-2) obtained above in Synthesis Example 7 was weighed and added to 150 g of GBL solvent, 2.11 g of polydipentaerythritol hexaacrylate (thermal crosslinking agent (b2)-1) and 3 g of quinone diazide compound, a photosensitizer, were then added, and the mixture was stirred for 1 hour to obtain slurry 14. The effect of the obtained slurry was evaluated, and the results were as shown in Table 3.

The synthesis proportions for the slurries in Examples 1-11 and Comparative Examples 1-3 were as shown in Table 2.

TABLE 2

| | Polymer (a) | Thermal cross-linking agent (b1) | Thermal crosslinking agent (b2) | Photo-sensitizer (c) | Solvent |
|---|---|---|---|---|---|
| Example 1 | (a-1) 10 g | (b1)-1 2-0 g | (b2)-1 0.11 g | Quinone diazide compound 3 g | GBL 150 g |
| Example 2 | (a-2) 10 g | (b1)-1 2.0 g | (b2)-1 0.11 g | | |
| Example 3 | (a-2) 10 g | (b1)-1 2.0 g | (b2)-2 0.11 g | | |
| Example 4 | (a-3) 10 g | (b1)-1 2.0 g | (b2)-1 0.11 g | | |
| Example 5 | (a-4) 10 g | (b1)-1 2.0 g | (b2)-1 0.11 g | | |
| Example 6 | (a-5) 10 g | (b1)-1 2.0 g | (b2)-2 0.11 g | | |
| Example 7 | (a-6) 10 g | (b1)-1 2.0 g | (b2)-1 0.11 g | | |
| Example 8 | (a-7) 10 g | (b1)-1 2-0 g | (b2)-2 0.11 g | | |
| Example 9 | (a-7) 10 g | (b1)-1 2.0 g | (b2)-1 0.11 g | | |
| Example 10 | (a-8) 10 g | (b1)-1 2.0 g | (b2)-3 0.11 g | | |
| Example 11 | (a-9) 10 g | (b1)-1 2.0 g | (b2)-3 0.11 g | | |
| Comparative Example 1 | (a-10) 10 g | (b1)-1 2.0 g | (b2)-1 0.11 g | | |
| Comparative Example 2 | (a-2) 10 g | (b1)-1 2.0 g | — | | |
| Comparative Example 3 | (a-2) 10 g | — | (b2)-1 2.11 g | | |

Performance Test Method

In the examples, the molecular weight of the resin composition can be tested by means of ordinary GPC, the viscosity can be tested by means of E-type viscometer, and the film thickness can be tested by means of an ordinary film thickness meter. The evaluation of the resin film formed from the resin composition was carried out according to the following method.

1. Evaluation Method for Thermal Crosslinking Groups:

Thermal mechanical analysis (TMA) was used in the present invention to test the glass transition temperature $T_g$ (equipment model: DSC3500, Netzsch); in addition, methods such as dynamic mechanical analysis (DMA) and differential scanning calorimeter (DSC) may also be used for testing. The specific method was as follows: the prepared varnish was subjected to spin-coating, drying, exposure, development, heat treatment and curing to obtain a photosensitive resin film with a film thickness of 5 μm±0.1 μm; and then, the photosensitive resin film was prepared into a sample for thermal mechanical analysis testing, and the sample was tested to obtain the $T_g$ value. $T_g$ represented the kinematic properties of molecular chain segments. The greater the $T_g$ value, the smaller the kinematic properties of the molecular chain segments, that is, the more excellent the thermal crosslinking degree. When $T_g$≥335° C., the thermal crosslink-ng degree was excellent and evaluated as ○; when $T_g$ was 325-335° C., the thermal crosslinking degree was good and evaluated as Δ, and when $T_g$≤325° C., the thermal crosslinking degree was poor and evaluated as X.

2. Evaluation Method for Flatness Index:

CD-SEM (Equipment Model: SU3500 from Hitachi-Hightechnology) was used in the present invention to test flatness index. The specific method was as follows: The prepared varnish was subjected to spin-coating and pre-drying, such that the film thickness was 4 μm±0.1 μm; then, exposure and development processes were carried out, after which the film thickness was tested to be $h_1$, and a heat treatment and curing process was then carried out, after which the film thickness was tested to be $h_2$; and $h_1$ and $h_2$ were tested by means of CD-SEM. The flatness index (%) was calculated according to the following formula (1). The greater the flatness index, the greater the shrinkage deformation of the film during heat treatment and curing, and the worse the flatness degree. The smaller the flatness index, the smaller the shrinkage deformation of the film during heat treatment and curing, the better the flatness degree. The flatness degree ultimately affected the properties such as efficiency, yield, and service life of the device. If the flatness index is ≤25%, it was evaluated as excellent and marked as ○; When the flatness index was 25% to 35%, it was evaluated as good and marked as Δ; and when the flatness index was ≥35%, it was evaluated as poor and marked as X.

$$\text{Flatness index}(\%)=(h_1-h_2)/h_1\times 100\% \quad \text{formula (1)}$$

3. Evaluation of Flexibility Index:

A tensile testing machine (Equipment Model: RTG1210 from Tensilon) was used in the present invention to test the mechanical properties of the film. The specific method was as follows: the prepared varnish was subjected to spin-coating, drying, and heat treatment and curing to obtain an ordinary resin film with a film thickness of 5 μm±0.1 μm; and the ordinary resin film was then prepared into specimen strips for a tensile test, and the data of the tensile strength, elongation and Young's modulus were obtained. The tensile strength indicated the degree of susceptibility to breakage when stress deformation occurs, so the greater the tensile strength, the better. The elongation indicated the degree of elongation movement of molecular chains when stress deformation occurs. When the elongation is too small, the elongation movement of the molecular chains was very small/very difficult, that is, elastic deformation hardly occurred. When the elongation was too large, plastic deformation easily occurred, and when stress deformation occurred, recovery was difficult. Only when the elongation was within a certain range, it could be conducive to bending recovery. The Young's modulus indicated the rigidity of a material, that is, when the rigidity was too large, stress deformation hardly occurred, and when the rigidity was too small, plastic deformation easily occurred, which made it difficult to recover after deformation. Therefore, only when the Young's modulus was within a certain range, it could be conducive to bending recovery. That is, the flexibility index also reflected the bending recovery performance. When the tensile strength was ≥120 MPa, the elongation range was between 5% and 28%, and when the Young's modulus range was between 0.5 and 9.0 GPa, the flexibility index was excellent and evaluated as ◎; when the tensile strength range was between 90 and 120 MPa, the elongation range was between 5% and 28%, and when the Young's modulus range was between 0.5 and 9.0 GPa, the flexibility index was good and evaluated as ○; when the tensile strength was ≥90 MPa, the elongation was ≥28% or ≤2%, and the Young's modulus was ≥9.0 GPa or ≤0.5 GPa, the flexibility index was moderate and evaluated as Δ; and when the tensile strength was ≤90 MPa, the flexibility index was poor and evaluated as X.

The evaluation results of Examples 1-11 and Comparative Examples 1-3 were as shown in Table 3.

TABLE 3

| | Evaluation results | | | |
|---|---|---|---|---|
| | Glass transition temperature $T_g$/° C. | Thermal crosslinking degree grade | Flatness index grade | Flexibility index |
| Example 1 | 336.0 | ○ | Δ~○ | ○ |
| Example 2 | 337.0 | ○ | ○ | ◎ |
| Example 3 | 336.0 | ○ | ○ | ◎ |
| Example 4 | 338.0 | ○ | ○ | ◎ |
| Example 5 | 341.0 | ○ | Δ~○ | ○ |
| Example 6 | 340.0 | ○ | ○ | ◎ |
| Example 7 | 339.0 | ○ | Δ-○ | ○ |
| Example 8 | 338.0 | ○ | Δ | ○ |
| Example 9 | 342.0 | ○ | Δ | ○ |
| Example 10 | 336.0 | Δ | ○ | ◎ |
| Example 11 | 335.0 | Δ | ○ | ◎ |
| Example 1 | | | | |
| Comparative | 326.0 | Δ | X-Δ | Δ |
| Example 2 | | | | |
| Comparative | 318.0 | X | X | Δ |
| Example 3 | | | | |

According to the evaluation results of Examples 1-11 and Comparative Examples 1-3 in Table 3 above, Examples 2-4 and 6 had excellent thermal crosslinking degree grade, flatness index grade and flexibility index. In other words, the resin compositions of Examples 2-4 and 6 above could result in a better flatness and bending recovery performance, which was ideal.

With regard to Examples 1, 5 and 7-9, the thermal crosslinking degree grade was excellent, the flatness index grade was excellent or good, and the flexibility index was evaluated as good; and they were slightly worse than ideal Examples 2-4 and 6 in terms of both flatness index grade performance and flexibility index. With regard to Examples 10 and 11, the thermal crosslinking degree grade was good, the flatness index grade was excellent, and the flexibility index was evaluated as superior; and the thermal crosslinking degree grade was worse than that of ideal Examples 1-9, but the superior flexibility index was maintained. Therefore, compared with Examples 2-4 and 6, Examples 1, 5 and 7-11 are sub-ideal.

With regard to Comparative Examples 1-3, the thermal crosslinking degree grade was evaluated as good or poor, the flatness index grade was evaluated as good or poor, and the flexibility index was evaluated as moderate; and compared with Examples 1-11, the comprehensive performance was poor, which was not ideal.

What is claimed is:

1. A resin composition comprising at least three components (a), (b) and (c); wherein component (a) is a polymer having a structure represented by the following formula (1), component (b) comprises thermal crosslinking agent (b1) and thermal crosslinking agent (b2), and component (c) is a photosensitizer, formula (1)

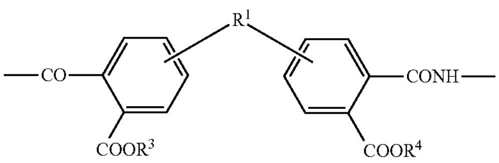

-continued

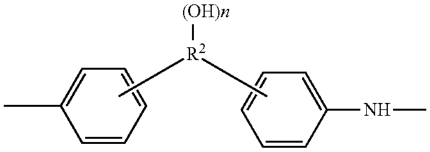

wherein $R^1$ and $R^2$ are independently selected from groups containing at least one atom other than hydrogen; and $R^3$ and $R^4$ are independently selected from a hydrogen atom or an organic group having 1 to 20 carbon atoms, and n is an integer selected from 1 to 10;

the thermal crosslinking agent (b1) is selected from a low-temperature thermal crosslinking compound with a thermal crosslinking temperature of 120° C. to 180° C., more particularly from a structure represented by the following formula (2), formula (2)

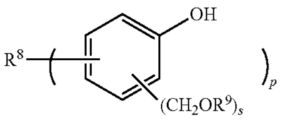

wherein $R^8$ is selected from an organic group containing 2 to 30 carbon atoms; $R^9$ is selected from an organic group containing 1 to 10 carbon atoms; s is an integer selected from 1 to 4, p is an integer selected from 1 to 16, and s+p>2;

the thermal crosslinking agent (b2) is selected from a thermal crosslinking compound with a thermal crosslinking temperature of 180° C. to 400° C., more particularly selected from one or more structures represented by the following formula (3), formula (5)

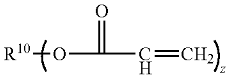

wherein $R^{10}$ is selected from an organic group containing 2 to 25 carbon atoms, and z is an integer selected from 1 to 10;

relative to 100 parts by mass of the total amount of component (a) in the resin composition, the thermal crosslinking agent (b1) and the thermal crosslinking agent (b2) are 10 to 40 parts by mass in total, the ratio of the part by mass of thermal crosslinking agent (b1) to the part by mass of thermal crosslinking agent (b2) is 25:1 to 5:1, the photosensitizer of component (c) is a photoacid generator.

2. The resin composition according to claim 1, wherein the component (a) is a polymer having a structure represented by the following formula (6), formula (6)

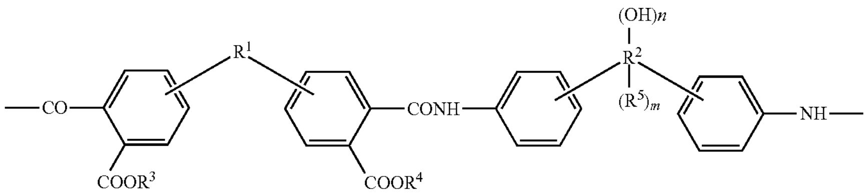

wherein $R^1$ and $R^2$ are independently selected from groups containing at least one atom other than hydrogen; $R^3$ and $R^4$ are independently selected from a hydrogen atom or an organic group having 1 to 20 carbon atoms, and $R^5$ is selected from a halogen and/or a halogenated hydrocarbyl and/or an organic group having 1 to 10 carbon atoms; and n and m are independently integer selected from 1 to 10.

3. The resin composition according to claim 1, wherein the resin composition further comprises one or more of polyamide, polyimide, a polyimide precursor, polybenzoxazole, a polybenzoxazole precursor, or copolymers thereof.

4. The resin composition according to claim 1, wherein the resin composition further comprises a phenolic hydroxyl compound.

5. A photosensitive resin film prepared from the resin composition according to claim 1.

6. A display device comprising the photosensitive resin film to claim 5.

7. A display device prepared from the photosensitive resin precursor composition according to claim 1.

* * * * *